(12) United States Patent
Seshita

(10) Patent No.: US 9,525,415 B2
(45) Date of Patent: *Dec. 20, 2016

(54) RADIO FREQUENCY SEMICONDUCTOR SWITCH

(71) Applicant: KABUSHUKI KAISHA TOSHIBA, Minato-ku, Tokyo (JP)

(72) Inventor: Toshiki Seshita, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 100 days.

This patent is subject to a terminal disclaimer.

(21) Appl. No.: 14/557,503

(22) Filed: Dec. 2, 2014

(65) Prior Publication Data

US 2015/0109032 A1   Apr. 23, 2015

Related U.S. Application Data

(63) Continuation of application No. 13/420,640, filed on Mar. 15, 2012, now Pat. No. 8,923,784.

(30) Foreign Application Priority Data

Aug. 31, 2011  (JP) ................................ 2011-189411
Dec. 13, 2011  (JP) ................................ 2011-272109

(51) Int. Cl.
*H03K 17/00* (2006.01)
*H03K 17/693* (2006.01)
*H04B 1/48* (2006.01)

(52) U.S. Cl.
CPC .............. *H03K 17/693* (2013.01); *H04B 1/48* (2013.01)

(58) Field of Classification Search
CPC ..................................................... H03K 17/00
See application file for complete search history.

(56) References Cited

U.S. PATENT DOCUMENTS 5,804,893 A    9/1998  Fujioka
8,923,781 B2 * 12/2014 Kunishi ................ H03K 3/354
                                                      327/415

(Continued)

FOREIGN PATENT DOCUMENTS

JP    2000-294786 A    10/2000

OTHER PUBLICATIONS

Office Action mailed on Mar. 30, 2015 in the corresponding CN application No. 201210055846.6 (English translation attached).

(Continued)

*Primary Examiner* — Hai L Nguyen
(74) *Attorney, Agent, or Firm* — Posz Law Group, PLC

(57) ABSTRACT

According to one embodiment, a semiconductor switch includes a power supply, a driver, a switch section, and a first potential controller. The power supply includes a first potential generator and a second potential generator. The first potential generator is configured to generate a negative first potential. The second potential generator is configured to generate a positive second potential that a power supply potential is stepped down. The driver is supplied with the first potential and a third potential and configured to output at least one of the first potential and the third potential based on a terminal switching signal. The switch section is configured to connect a common terminal to any one of a plurality of radio frequency terminals according to an output of the driver. The first potential controller includes a divider and an amplifier.

9 Claims, 24 Drawing Sheets

(56) References Cited

U.S. PATENT DOCUMENTS

| | | | |
|---|---|---|---|
| 8,923,784 B2 * | 12/2014 | Seshita | H03K 17/693 327/415 |
| 8,937,503 B2 * | 1/2015 | Seshita | H03K 17/693 327/415 |
| 2003/0062948 A1 | 4/2003 | Notani et al. | |
| 2005/0151581 A1 | 7/2005 | Otsuka et al. | |
| 2007/0013432 A1 | 1/2007 | Miyazawa | |
| 2009/0167418 A1 | 7/2009 | Raghavan | |
| 2009/0322394 A1 | 12/2009 | Song et al. | |
| 2011/0092179 A1 | 4/2011 | Burgener et al. | |
| 2011/0159822 A1 | 6/2011 | Kunishi et al. | |
| 2011/0187435 A1 | 8/2011 | Kamata | |
| 2012/0064952 A1 | 3/2012 | Iijima et al. | |

OTHER PUBLICATIONS

Background Art Information Sheet provided by Applicant, Dec. 7, 2011 (1 page total).
Office Action dated Jul. 30, 2014 issued in corresponding CN patent application No. 2012100558466 (and English translation).

\* cited by examiner

RADIO FREQUENCY SEMICONDUCTOR SWITCH

CROSS-REFERENCE TO RELATED APPLICATIONS

This application is a continuation of U.S. patent application Ser. No. 13/420,640 filed on Mar. 15, 2012, now U.S. Pat. No. 8,923,784 issued on Dec. 30, 2014, which is based upon and claims the benefit of priority from the prior Japanese Patent Application No. 2011-189411, filed on Aug. 31, 2011 and Japanese Patent Application No. 2011-272109, filed on Dec. 13, 2011; the entire contents of which are incorporated herein by reference.

FIELD

Embodiments described herein relate generally to a semiconductor switch and a wireless device.

BACKGROUND

A semiconductor switch is used in various electronic devices. For example, in a radio frequency circuit of a mobile phone, a transmitting circuit and a receiving circuit are selectively connected to a common antenna through a radio frequency switch circuit. For a switch element of such a radio frequency switch circuit, a MOSFET (Metal Oxide Semiconductor Field-Effect Transistor) formed on an SOI (Silicon On Insulator) substrate is used.

DETAILED DESCRIPTION

Figure 1:
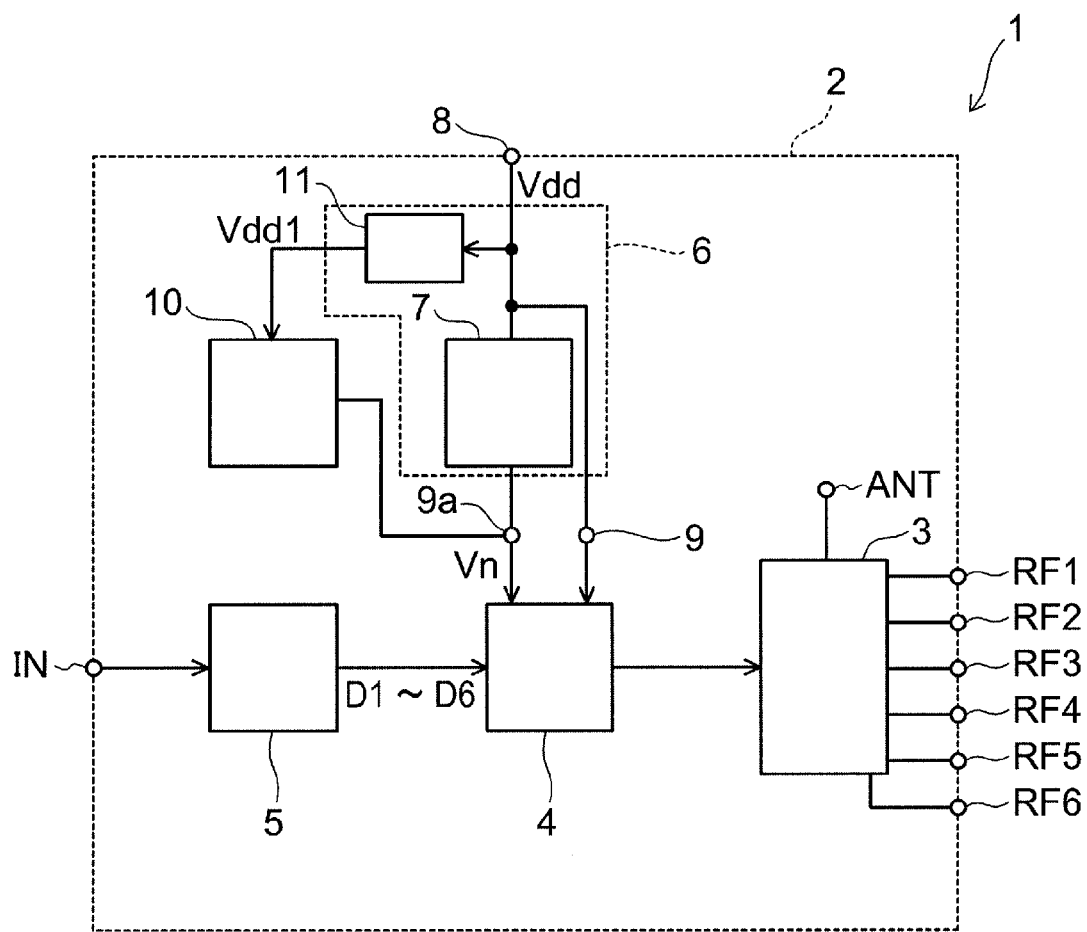
FIG. 1 is a block diagram illustrating a semiconductor switch according to a first embodiment.

In general, according to one embodiment, a semiconductor switch includes a power supply, a driver, a switch section, and a first potential controller. The power supply includes a first potential generator and a second potential generator. The first potential generator is configured to generate a negative first potential. The second potential generator is configured to generate a positive second potential that a power supply potential is stepped down. The driver is supplied with the first potential and a third potential and configured to output at least one of the first potential and the third potential based on a terminal switching signal. The switch section is configured to connect a common terminal to any one of a plurality of radio frequency terminals according to an output of the driver. The first potential controller includes a divider and an amplifier. The divider is configured to divide a potential difference between the first potential and the second potential. The amplifier is configured to control the first potential so that a potential divided at the divider approaches a reference potential.

Hereinbelow, embodiments are described with reference to the drawings. In the following description, identical components are marked with the same reference numerals, and a description of components once described is omitted as appropriate. The embodiments described below can be appropriately combined.

First Embodiment

First, a first embodiment will be described.

FIG. 1 is a block diagram illustrating a semiconductor switch according to the first embodiment.

A semiconductor switch 1 includes a switch section 3, a driver 4 that outputs a control signal to the switch section 3, an interface 5 that decodes a terminal switching signal IN, a power supply (a portion surrounded by a broken line 6) that generates a first potential Vn, which is the potential of the control signal and a second potential Vdd1 for an internal circuit, and a first potential controller 10 that stabilizes the first potential Vn. The semiconductor switch 1 is an SP6T (Single-Pole 6-Throw) switch that switches the connection between a common terminal ANT and a plurality of radio frequency terminals RF1 to RF6 according to the terminal switching signal IN.

The switch section 3 connects the common terminal ANT to any one of the plurality of radio frequency terminals RF1 to RF6 according to a control signal outputted from the driver 4. The switch section 3 is formed of a MOSFET in an SOI structure provided on an SOI substrate (a portion surrounded by a broken line 2), for example. The configuration and operation of the switch section 3 will be described with reference to FIG. 2, FIG. 3, and FIG. 4.

The driver 4 generates a control signal that switches the connection of the switch section 3 according to the terminal switching signal IN inputted through the interface 5. The driver 4 is formed of level shifters, for example.

The driver 4 is supplied with the first potential Vn as an Off-potential Voff and a positive potential as an ON-potential Von. Here, the Off-potential Voff is a low-level potential of the control signal. The Off-potential Voff is a potential that is applied to the gate of each FET of the switch section 3 for turning off each FET and can sufficiently keep the Off state even though a high-frequency signal is superimposed, for example. The ON-potential Von is a high-level potential of the control signal. The ON-potential Von is a potential that is applied to the gate of each FET of the switch section 3 for turning on each FET and has an ON resistance thereof to be a small enough value, for example. It is noted that in the semiconductor switch 1, a power supply potential Vdd is supplied as the ON-potential Von to the driver 4 through a high-potential supply terminal 9.

The interface 5 decodes the terminal switching signal IN externally inputted, and outputs decoded signals D1 to D6 to the driver 4. It is noted that the terminal switching signal IN inputted to the interface 5 may be parallel data or may be serial data. The configurations and operations of the driver 4 and the interface 5 will be described with reference to FIG. 5 and FIG. 6.

The power supply 6 includes a first potential generator 7 that generates a negative first potential Vn from the power supply potential Vdd and a second potential generator 11 that generates the second potential Vdd1, which the power supply potential Vdd is stepped down. The first potential Vn is supplied from the power supply 6 provided on the SOI substrate 2 to the driver 4 through a low-potential supply terminal 9a. The second potential Vdd1 is supplied to the first potential controller 10 as power for the internal circuit. It is noted that the second potential generator 11 is a voltage regulator such as a series regulator, for example. There is the case where an internal power supply is necessary, which steps down the power supply potential Vdd to generate a constant positive potential, as in the case where the power supply potential Vdd fluctuates, or as in the case where the supply of the power supply potential Vdd higher than the breakdown voltage of the internal circuit is accepted. In this case, the second potential generator 11 can be used for an internal power supply. The configuration and operation of the first potential generator 7 will be described with reference to FIG. 7.

The first potential controller 10 is supplied with the second potential Vdd1 and the first potential Vn, and stabilizes the first potential Vn based on the internal reference potential for suppressing fluctuations of the first potential Vn caused by variations in manufacture or the like. It is noted that the configuration and operation of the first potential controller 10 will be described with reference to FIG. 8.

The semiconductor switch 1 is an SP6T (Single-Pole 6-Throw) switch that switches the connection between the common terminal ANT and the radio frequency terminals RF1 to RF6 according to the terminal switching signal IN. The switch section 3 has a multi port, and can be used for a multimode and multiband wireless device or the like. It is noted that an SP6T switch is illustrated for explanation in the following explanation. However, the semiconductor switch 1 can be similarly applied to switches in other configurations, and can also configure a wPkT (w is a natural number and k is two natural numbers or more) switch.

Next, the configurations and operations of components will be described.

Figure 2:
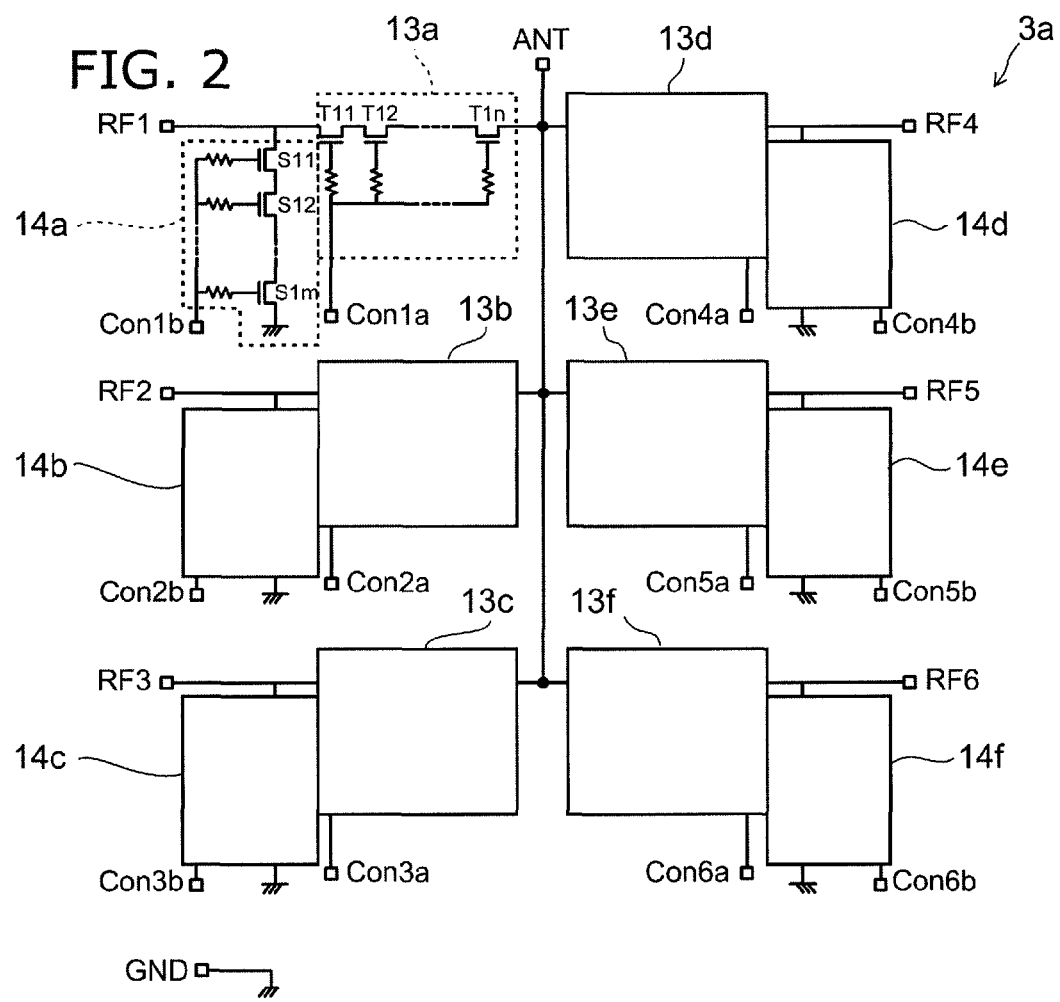
FIG. 2 is a circuit diagram illustrating a switch section according to the first embodiment.

FIG. 2 is a circuit diagram illustrating a switch section according to the first embodiment.

A switch section 3a is an SP6T switch that switches the connection between the common terminal ANT and the plurality of radio frequency terminals RF1 to RF6. First switch elements 13a, 13b, 13c, 13d, 13e, and 13f are connected between the common terminal ANT and the radio frequency terminals RF1, RF2, RF3, RF4, RF5, and RF6, respectively. The first switch elements 13a, 13b, 13c, 13d, 13e, and 13f are individually turned on, so that the common terminal ANT and the radio frequency terminals RF1, RF2, RF3, RF4, RF5, and RF6 are conducted to each other.

In the first switch element 13a, through FETs T11, T12 to T1n in n stages (n is a natural number) are connected in series. A control signal Con1a is inputted to the gate of each of the through FETs T11, T12 to T1n through a resistor for preventing radio frequency leakage. The first switch elements 13b, 13c, 13d, 13e, and 13f have the same configuration as the configuration of the first switch element 13a. Control signals Con2a, Con3a, Con4a, Con5a, and CoN6a are inputted to the first switch elements 13b, 13c, 13d, 13e, and 13f, respectively.

Second switch elements 14a, 14b, 14c, 14d, 14e, and 14f are connected between the radio frequency terminals RF1, RF2, RF3, RF4, RF5, and RF6 and a ground GND, respectively. The second switch elements 14a, 14b, 14c, 14d, 14e, and 14f release a leakage current carried through the radio frequency terminals RF1, RF2, RF3, RF4, RF5, and RF6 to the ground GND when the first switch elements 13a, 13b, 13c, 13d, 13e, and 13f are turned off, and improve the isolation between the radio frequency terminals RF1, RF2, RF3, RF4, RF5, and RF6.

In the second switch element 14a, shunt FETs S11, S12 to S1m in m stages (m is a natural number) are connected in series. A control signal Con1b is inputted to the gate of each of the shunt FETs S11, S12 to S1m through a resistor for preventing radio frequency leakage. The second switch elements 14b, 14c, 14d, 14e, and 14f have the same configuration as the configuration of the second switch element 14a. Control signals Con2b, Con3b, Con4b, Con5b, and Con6b are inputted to the second switch elements 14b, 14c, 14d, 14e, and 14f, respectively.

For example, when control is performed as below, the radio frequency terminal RF1 and the common terminal ANT are conducted to each other. The first switch element 13a between the radio frequency terminal RF1 and the common terminal ANT is turned on, and the second switch element 14a between the radio frequency terminal RF1 and the ground GND is turned off. Namely, the through FETs T11, T12 to T1n of the first switch element 13a are all turned on, and the shunt FETs S11, S12 to S1m of the second switch element 14a are all turned off.

At the same time, the first switch elements 13b, 13c, 13d, 13e, and 13f between the other radio frequency terminals RF2, RF3, RF4, RF5, and RF6 and the common terminal ANT are all turned off, and the second switch elements 14b, 14c, 14d, 14e, and 14f between the other radio frequency terminals RF2, RF3, RF4, RF5, and RF6 and the ground GND are all turned on. Namely, the through FETs of the first switch elements 13b, 13c, 13d, 13e, and 13f are all turned off, and the shunt FETs of the second switch elements 14b, 14c, 14d, 14e, and 14f are all turned on.

In the aforementioned case, the control signal Con2a is set to the ON-potential Von, the control signals Con2b, Con3b, Con4b, Con5b, and Con6b are set to the ON-potential Von, the control signal Con1b is set to the Off-potential Voff, and the control signals Con2a, Con3a, Con4a, Con5a, and CoN6a are set to the Off-potential Voff.

As described above, the ON-potential Von is a potential that turns each FET into a conducting state and causes the ON resistance of the FET to have a sufficiently small value. The Off-potential Voff is a potential that turns each FET into a blocking state and can sufficiently keep the blocking state even though an RF signal is superimposed.

When the ON-potential Von is lower than a desired potential (2.4 V, for example), the ON resistance of the FET in the conducting state is increased, and an insertion loss deteriorates as well as a distortion (an ON distortion) generated in the FET in the conducting state is increased.

When the Off-potential Voff is higher than a desired potential, the maximum allowable input power is decreased as well as a distortion (an off distortion) generated in the FET in the blocking state is increased at the time of specified input. However, the off distortion deteriorates if the Off-potential Voff is too large in the negative side. The Off-potential Voff has an optimum point.

In a multiport switch like the semiconductor switch 1, one first switch element is in the On state, whereas (the port number −1) of first switch elements are in the Off state. Thus, the off distortion is a problem. For example, in the GSM (Global System for Mobile communications) standard, the maximum allowable value of input power is as large as 35 dBm, and it is important to suppress a harmonic distortion at this time. It is demanded for the specified value of the harmonic distortion that the value is −80 dBc or less, for example.

Figure 3:
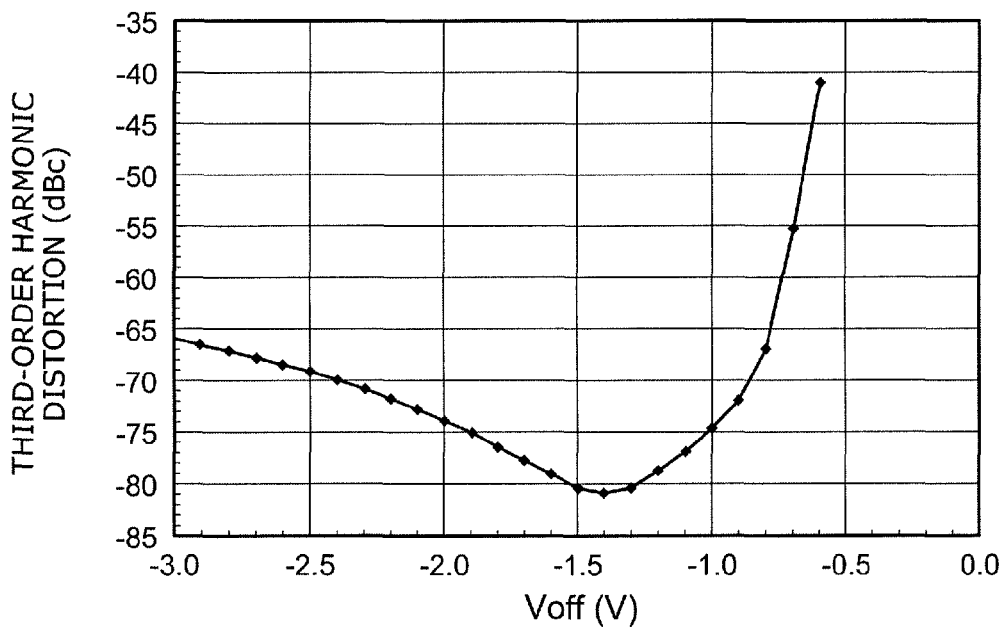
FIG. 3 is a characteristic diagram illustrating a dependency of a third-order harmonic distortion on an Off-potential Voff in the switch section according to the first embodiment.

FIG. 3 is a characteristic diagram illustrating a dependency of a third-order harmonic distortion on an Off-potential Voff in the switch section according to the first embodiment.

FIG. 3 expresses the dependency of the third-order harmonic distortion on the Off-potential Voff where an input power Pin is 35 dBm and a frequency is 900 MHz, that is, at the maximum input power in the GSM standard. It is noted that the number of stages of the through FET and the shunt FET of the switch section 3a is n=m=16 stages.

When the Off-potential Voff is −1.4 V, the third-order harmonic distortion takes the minimum value (−81 dBc). When the Off-potential Voff fluctuates from the optimum value, the off distortion such as the third-order harmonic distortion deteriorates. Therefore, it is necessary for the power supply 6 to generate the Off-potential Voff at the optimum value as the first potential Vn. It is noted that when input power is low as in the UMTS (Universal Mobile Telecommunications System) standard, the Off-potential Voff, which takes the lowest third-order harmonic distortion, is shifted on the positive side.

Figure 4:
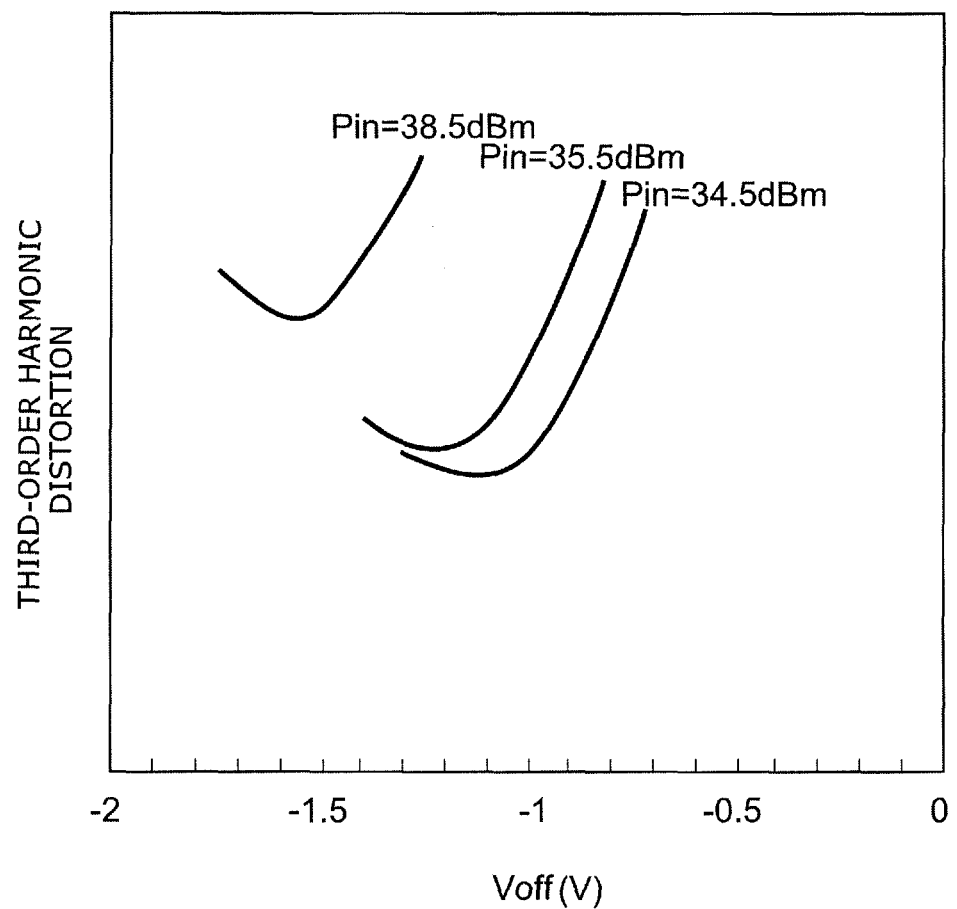
FIG. 4 is a characteristic diagram illustrating the dependency of the third-order harmonic distortion on the Off-potential Voff when an input power Pin is changed.

FIG. 4 is a characteristic diagram illustrating a dependency of the third-order harmonic distortion on the Off-potential Voff when an input power Pin is changed.

As illustrated in FIG. 4, as the input power Pin is reduced, the Off-potential Voff, which takes the smallest third-order harmonic distortion, is shifted on the positive side, that is, on the side where the potential is high. For example, the third-order harmonic distortion at the maximum input power in the UMTS standard takes the smallest value, where the Off-potential Voff is −0.8 V.

Figure 5:
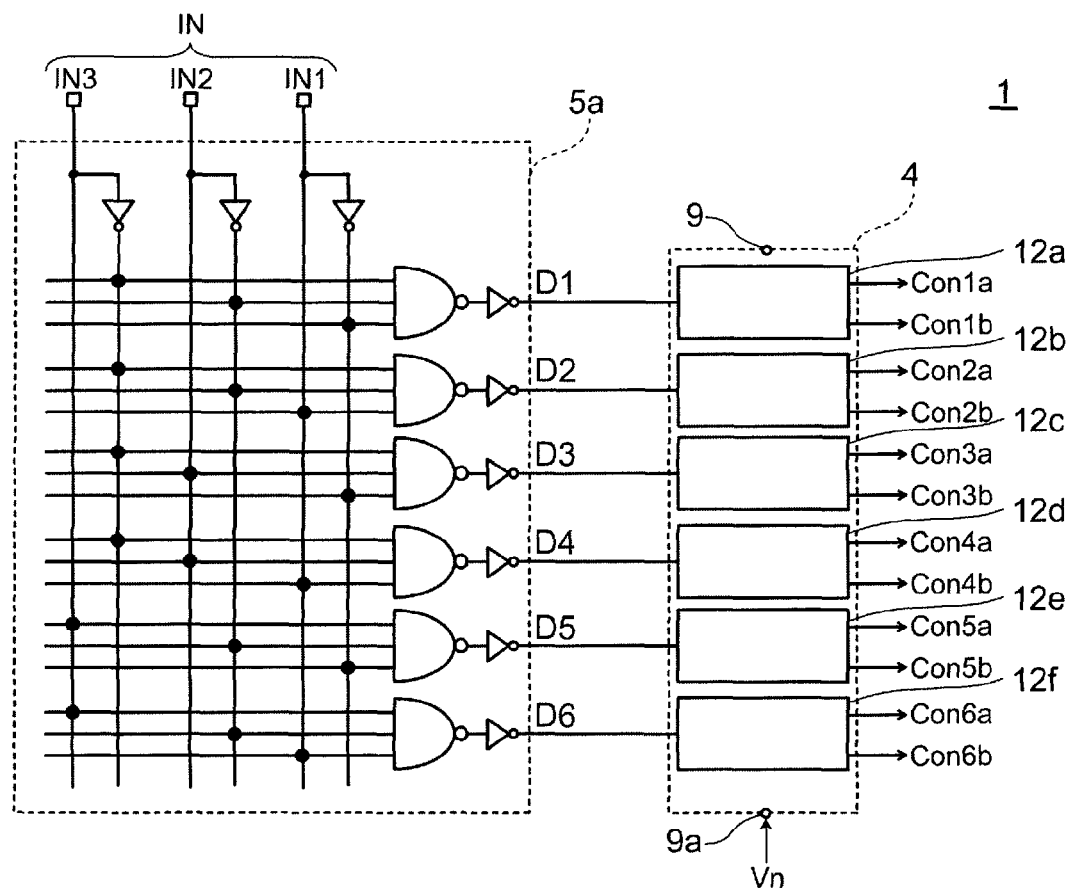
FIG. 5 is a circuit diagram illustrating an interface and a driver according to the first embodiment.

FIG. 5 is a circuit diagram illustrating an interface and a driver according to the first embodiment.

As illustrated in FIG. 5, an interface 5a decodes the inputted terminal switching signal IN. The semiconductor switch 1 includes the SP6T switch section 3. Thus, the interface 5a decodes three bits of the terminal switching signal IN. Here, the terminal switching signal IN is formed of three bits, IN1, IN2, and IN3, from the LSB side. The interface 5a outputs six bits of signals D1 (LSB), D2, D3, D4, D5, and D6 (MSB). The signals (the decode signals) D1 to D6 decoded at the interface 5a are inputted to the driver 4.

It is noted that in the case where six bits of signals are inputted as the terminal switching signal IN, or in the case where the number of the terminals of the switch section 3 is two, the interface 5a is unnecessary. In FIG. 5, the configuration is illustrated in the case where the terminal switching signal IN is parallel signals. However, a similar configuration can be provided also in the case of serial signals.

It is noted that the power supply potential Vdd is supplied to the interface 5a. However, the second potential Vdd1 may be supplied as the power supply potential to the interface 5a depending on the potential at the logic level of the terminal switching signal IN.

The driver 4 is formed of six level shifters 12a to 12f. As illustrated in FIG. 1, the high-potential supply terminal 9 of the driver 4 is connected to a power supply terminal 8. Thus, the power supply potential Vdd is supplied as a positive potential to the driver 4 through the high-potential supply terminal 9. The negative first potential Vn is supplied to the driver 4 through the low-potential supply terminal 9a.

The level shifters 12a to 12f receive the decode signals D1 to D6, level-shift the received signals in such a way that the high level is at the power supply potential Vdd (a third potential) and the low level is at the first potential Vn, and output the signals as the control signals Con2a to Con6a and Con1b to Con6b.

The level shifter 12a receives the signal D1, which is the LSB among the decode signals D1 to D6, and outputs the control signals Con2a and Con1b. The level shifters 12b to 12f receive one bit of the decode signals D1 to D6, respectively, and output the control signals Con2a, Con2b to Con6a, and Con6b.

Figure 6:
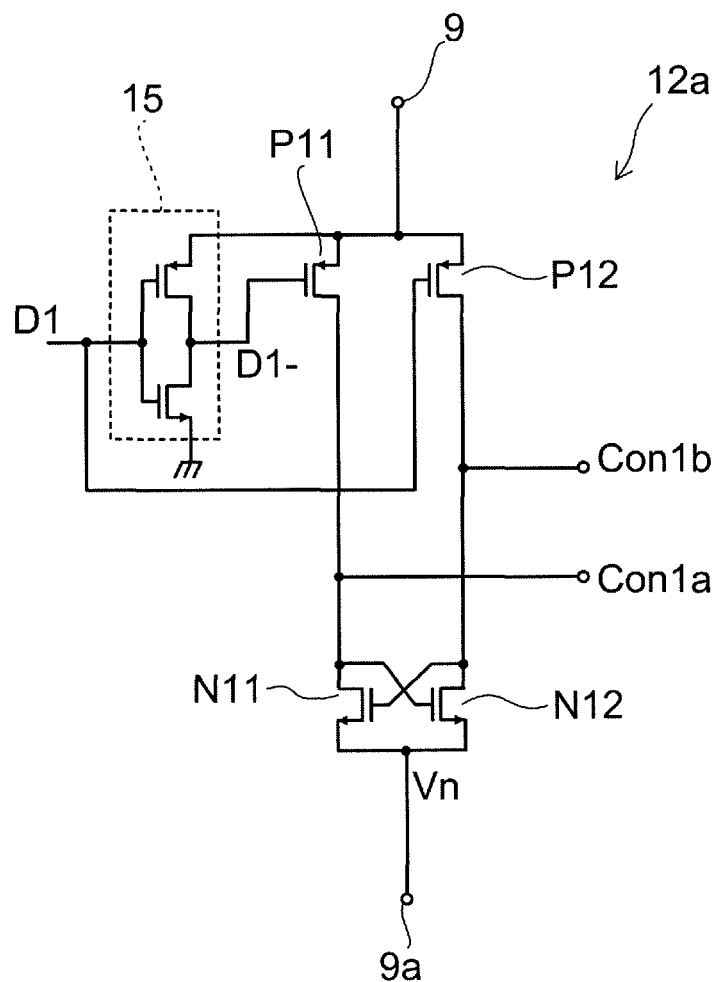
FIG. 6 is a circuit diagram illustrating a level shifter.

FIG. 6 is a circuit diagram illustrating a level shifter.

FIG. 6 illustrates the level shifter 12a constituting the driver 4. The other level shifters 12b to 12f constituting the driver 4 are similarly configured as the level shifter 12a.

In the level shifter 12a, an inverter 15, which is a CMOS (Complementary Metal Oxide Semiconductor), generates an inverting signal D1− of the signal D1, which is the LSB decode signal. The signals D1 and D1− are inputted as differential signals to a pair of N-channel MOSFETs (in the following, referred to as an NMOS) N11 and N12 and a pair of P-channel MOSFETs (in the following, referred to as a PMOS) P11 and P12.

The signals D1- and D1 are inputted to the gates of the PMOSs P11 and P12, respectively. The power supply potential Vdd is supplied to the sources of the PMOSs P11 and P12 through the high-potential supply terminal 9.

The drain of the PMOS P11 is connected to the drain of the NMOS N11. The control signal Con1a is outputted from the drain of the PMOS P11 and the drain of the NMOS N11. The drain of the PMOS P12 is connected to the drain of the NMOS N12. The control signal Con1b is outputted from the drain of the PMOS P12 and the drain of the NMOS N12. The control signals Con1a and Con1b are outputted as differential signals from the level shifter 12a.

The sources of the NMOSs N11 and N12 are connected to the low-potential supply terminal 9a. The gate of the NMOS N11 is connected to the drain of the NMOS N12. The gate of the NMOS N12 is connected to the drain of the NMOS N11.

The control signal Con1a is supplied to the gate of each through FET of the first switch element 13a. The control signal Con1b is supplied to the gate of each shunt FET of the second switch element 14a. The gates are turned at the ON-potential Von or the Off-potential Voff according to the terminal switching signal IN (IN1 to IN3).

For example, suppose that the signal D1 is at low level (0 V), the potential of the control signal Con1b is made equal to the power supply potential Vdd (2.4 V, for example), and the potential of the control signal Con1a is made equal to the first potential Vn (for example, −1.5 V). The level shifter 12a outputs the power supply potential Vdd (2.4 V, for example) as the ON-potential Von and the first potential Vn (−1.5 V, for example) as the Off-potential Voff.

It is noted that it is sufficient for the level shifter 12a to level-shift the decode signals D1 and D1−, in which the high level is at the power supply potential Vdd and the low level is at 0 V, to the control signals Con1a and Con1b, in which the high level is at the power supply potential Vdd and the low level is at the first potential Vn. The level shifter 12a may not have the configuration illustrated in FIG. 6, and may have other configurations. The same thing is applied to the level shifters 12b to 12f.

Figure 7:
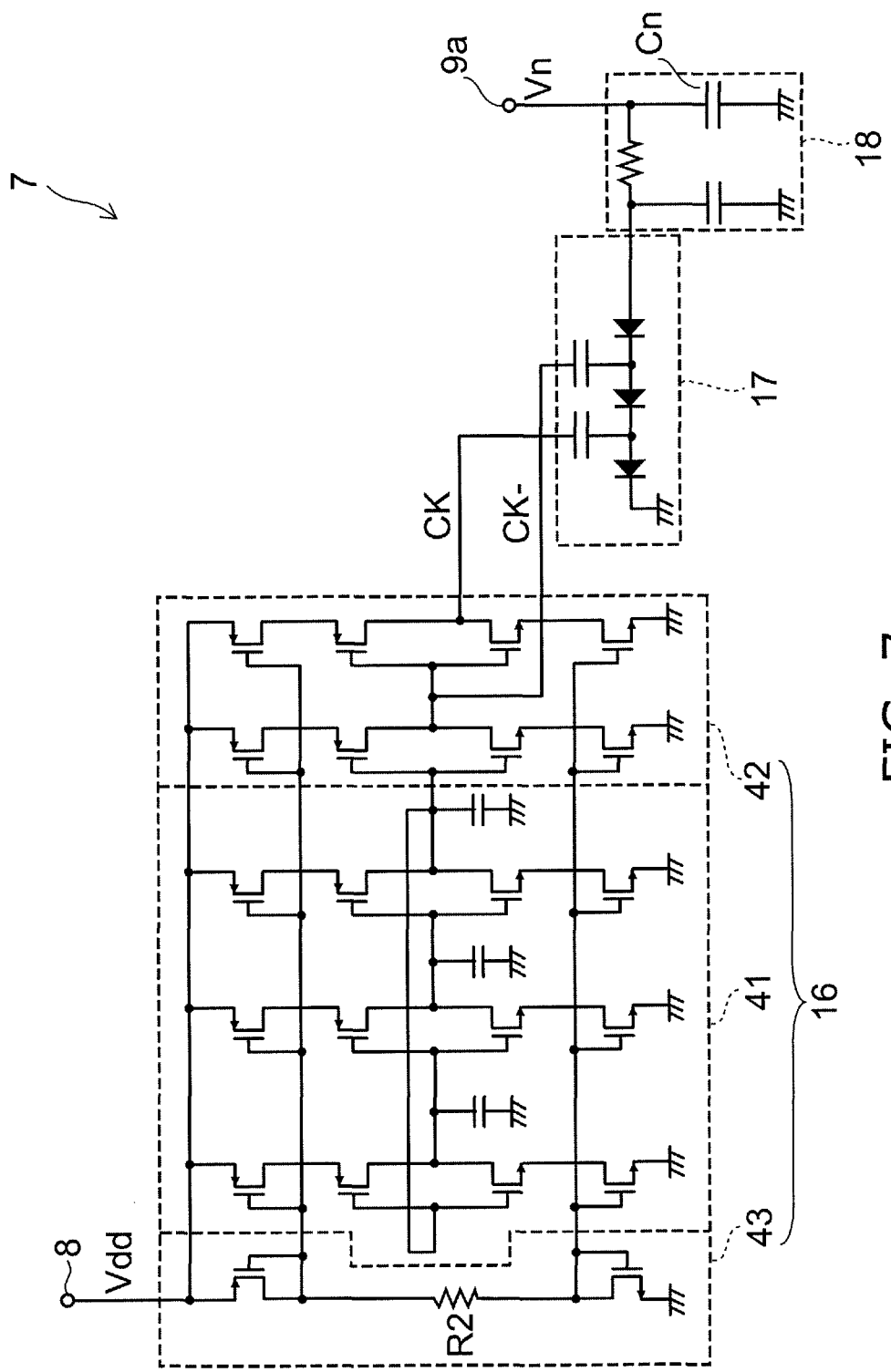
FIG. 7 is a circuit diagram illustrating a first potential generator of a power supply according to the first embodiment.

FIG. 7 is a circuit diagram illustrating a first potential generator of a power supply according to the first embodiment.

As illustrated in FIG. 7, the first potential generator 7 is formed of an oscillator 16, a charge pump 17, and a lowpass filter 18.

The oscillator 16 is constituted of a ring oscillator 41 formed of inverters in odd-numbered stages, an output buffer 42, and a bias circuit 43, and outputs differential clock signals CK and CK−.

The bias circuit 43 supplies a bias to the ring oscillator 41 and the output buffer 42. A resistor R2 of the bias circuit 43 regulates a current carried through the ring oscillator 41 and the output buffer 42.

The charge pump 17 includes three diodes connected in series and two capacitors having one end thereof connected between the diodes. The cathode side of three diodes connected in series is connected to the ground GND, and the anode side is connected to the lowpass filter 18. The other end of each of the capacitors is alternately supplied with the differential clock signals CK and CK− supplied from the oscillator 16.

A negative voltage is generated at the charge pump 17 because of the storage and movement of electric charges caused by the differential clock signals CK and CK−. The lowpass filter 18 is formed of a resistor and a capacitor, and removes output noise of the charge pump 17. The terminal voltage of an output capacitor Cn of the lowpass filter 18 connected to the low-potential supply terminal 9a with respect to the ground GND is the first potential Vn.

It is noted that in this embodiment, the configuration is illustrated in which the first potential generator 7 is connected to the power supply terminal 8 and supplies the power supply potential Vdd. However, the first potential generator 7 may supply an internal power supply potential, such as the second potential Vdd1, for example. The same thing is applied to the other embodiments described below.

Furthermore, the first potential generator 7 that generates the negative first potential Vn is described. However, a potential generator that generates a positive potential higher than the power supply potential Vdd can also be similarly configured.

Figure 8:
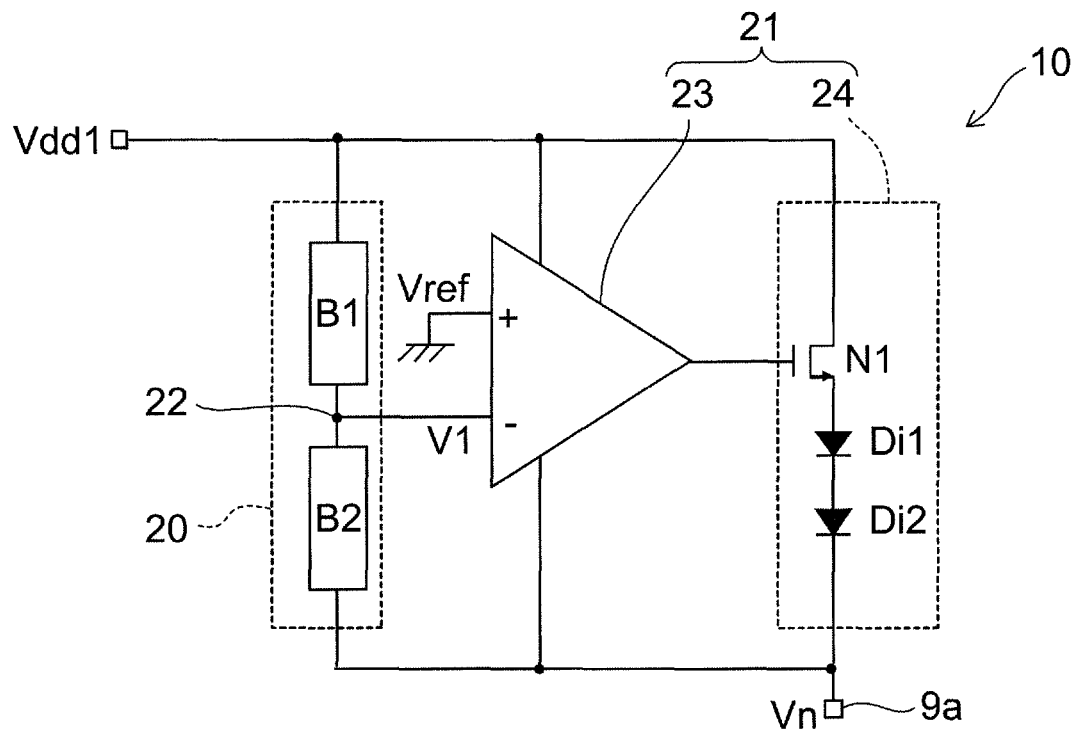
FIG. 8 is a circuit diagram illustrating a first potential controller according to the first embodiment.

FIG. 8 is a circuit diagram illustrating a first potential controller according to the first embodiment.

The first potential controller 10 is formed of a divider (a portion surrounded by a broken line 20) that divides a potential difference between the first potential Vn and the second potential Vdd1 and outputs the divided potential difference as a potential V1 and an amplifier 21 that controls the first potential Vn in such a way that the magnitude (the absolute value) of a potential difference between the potential V1 and the reference potential Vref is made smaller, i.e. the potential V1 approaches the reference potential Vref.

The divider 20 is formed of dividing elements B1 and B2 connected in series. The second potential Vdd1 is supplied to one end of the dividing element B1, the other end of the dividing element B1 is connected to one end of the dividing element B2, and the other end of the dividing element B2 is connected to the low-potential supply terminal 9a. The potential V1 that a potential difference between the second potential Vdd1 and the first potential Vn is divided is generated at a connection point 22 between the other end of the dividing element B1 and the one end of the dividing element B2.

The amplifier 21 includes a differential amplifier 23 and a source follower 24, configuring a current output voltage follower.

The divided potential V1 is inputted to the inverting input terminal (−) of the differential amplifier 23, and a ground potential of 0 V is inputted to the non-inverting input terminal (+) as the reference potential Vref. The output of the differential amplifier 23 is inputted to the source follower 24. The differential amplifier 23 is supplied with the second potential Vdd1 and the first potential Vn as the power supply potential.

The source follower 24 includes an NMOS N1 and diodes Di1 and Di2. The gate of the NMOS N1 is connected to the output of the differential amplifier 23, the drain is supplied with the second potential Vdd1, and the source is connected to the anode of the diode Di1. The cathode of the diode Di1 is connected to the anode of the diode Di2, and the cathode of the diode Di2 is connected to the low-potential supply terminal 9a. The source follower 24 is a source follower that the first potential generator 7 and the driver 4 connected to the low-potential supply terminal 9a are a load. The first potential Vn that is the output potential of the source follower 24 is fed back to the inverting input terminal (−) of the amplifier 21 through the dividing element B2.

Therefore, the first potential controller 10 operates as a current output type voltage follower, and controls the first potential Vn of the low-potential supply terminal 9a to be $Vn=-(B_2/B_1)\times Vdd1$, where the impedances of the dividing elements B1 and B2 are $B_1$ and $B_2$, respectively. The first potential Vn is −1.4 V, where the second potential Vdd1 is 1.4 V and the impedances of the dividing elements B1 and B2 are $B_1=B_2$, for example. The diodes Di1 and Di2 level-shift the gate potential of the NMOS N1, that is, the output potential of the differential amplifier 23 to near a ground potential of 0 V by level-shifting the source potential of the NMOS N1 on the positive side. As a result, it is possible to widen the control range of the first potential Vn as compared with the case where the diodes Di1 and Di2 are not provided.

Suppose that the dividing elements B1 and B2 are linear resistance elements and affected by variations in the manufacturing processes at the same time, the impedance ratio $B_1/B_2$ is made constant regardless of variations in the manufacturing processes. Suppose that the second potential generator 11 is a voltage regulator using a bandgap reference circuit, for example, the fluctuations of the second potential Vdd1 are extremely made small. As a result, it is possible to suppress the fluctuations of the first potential Vn caused by the influence of the manufacturing processes.

It is noted that the configuration is illustrated in which the diodes Di1 and Di2 are in two stages in the first potential controller 10. However, the number of stages is set in such a way that the output potential of the differential amplifier 23 is brought to near a ground potential of 0 V according to the values of the threshold Voltages of the first potential Vn, the second potential Vdd1, and the NMOS N1. For the diodes Di1 and Di2, a PN junction diode and a diode-connected FET, for example, can be used.

Next, a comparative example will be described.

Figure 9:
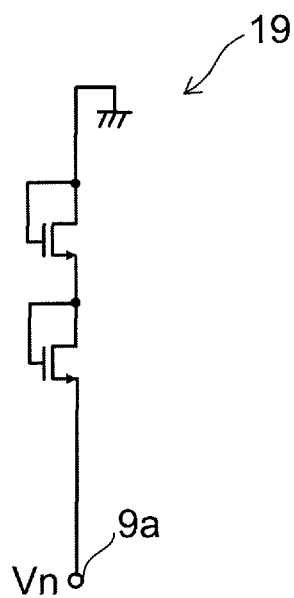
FIG. 9 is a circuit diagram illustrating a clamp circuit according to a comparative example.

FIG. 9 is a circuit diagram illustrating a clamp circuit according to the comparative example.

A clamp circuit 19 is formed of two NMOSs diode-connected to each other, which is connected between a low-potential supply terminal 9a and a ground, and clamps a first potential Vn based on the threshold voltage of the NMOS. For example, in the GSM standard, since the third-order harmonic distortion can be made the lowest by setting the first potential Vn to −1.4 V, the threshold voltage of the NMOS is set to 0.7 V. However, since the threshold voltage or the like of the NMOS is varied because of the influence of variations or the like in the manufacturing processes, in the case of using the clamp circuit 19, the clamping potential of the first potential Vn is to fluctuate. Since the clamp circuit 19 is formed of NMOSs in two stages connected in series, the threshold voltage is to be varied two times the voltage of variations in the threshold voltage of each NMOS. For example, suppose that variations in the threshold voltage are ±0.1 V, variations of the first potential Vn are about ±0.2 V, and the third-order harmonic distortion deteriorates by about 2 dB as shown from FIG. 3.

On the contrary, in this embodiment, the amplifier 21 of the first potential controller 10 controls the first potential Vn so as to reduce the magnitude of a potential difference between the potential V1 that a potential difference between the first potential Vn and the second potential Vdd1 is divided and the reference potential Vref. As a result, it is possible to suppress the fluctuations of the first potential Vn caused by the influence of variations in the manufacturing processes, and it is possible to suppress the deterioration of the third-order harmonic distortion.

In this embodiment, since the reference potential Vref of the first potential controller 10 is a ground potential of 0 V, there is no necessity of a circuit such as a bandgap reference circuit that generates the reference potential Vref. As a result, it is possible to suppress an increase in power consumption.

Second Embodiment

Next, a second embodiment will be described.

Figure 10:
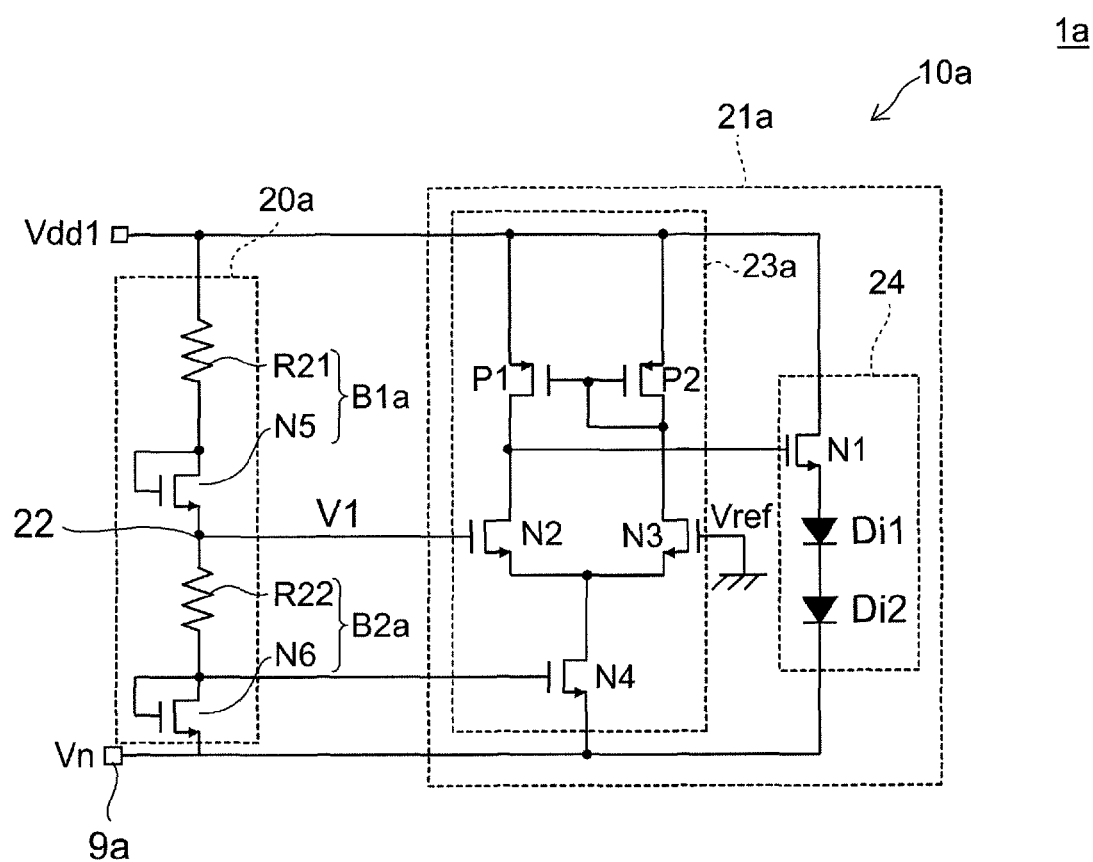
FIG. 10 a circuit diagram illustrating a first potential controller according to a second embodiment.

FIG. 10 a circuit diagram illustrating a first potential controller according to the second embodiment.

As illustrated in FIG. 10, this embodiment is different from the aforementioned first embodiment in the configuration of the first potential controller. Namely, in this embodiment, a first potential controller 10a is provided instead of the first potential controller according to the aforementioned first embodiment 10. The configurations other than the configuration of the first potential controller 10a of a semiconductor switch 1a according to this embodiment are the same as the configurations of the semiconductor switch 1 according to the first embodiment.

The first potential controller 10a is different from the first potential controller 10 according to the first embodiment in the configurations of the divider 20, the amplifier 21, and the differential amplifier 23. Namely, in the first potential controller 10a, a divider (a portion surrounded by a broken line 20a) is provided instead of the divider 20. A differential amplifier (a portion surrounded by a broken line 23a) is provided instead of the differential amplifier 23, and an amplifier 21a is formed of the differential amplifier 23a and a source follower 24.

The divider 20a includes a dividing element B1a formed of a resistor R21 and a third transistor N5, and a dividing element B2a formed of a resistor R22 and a first transistor N6. The gate and drain of the third transistor N5 are connected to one end of the resistor R21, and a second potential Vdd1 is supplied to the other end of the resistor R21. The source of the third transistor N5 is connected to one end of the resistor R22, and the other end of the resistor R22 is connected to the gate and drain of the first transistor N6. The source of the first transistor N6 is connected to a low-potential supply terminal 9a. A potential V1 that a potential difference between the second potential Vdd1 and a first potential Vn is divided is outputted to a connection point 22 between the source of the third transistor N5 and the one end of the resistor R22.

It is noted that the resistors R21 and R22 are the same type of resistors, and the resistance of the resistor R21 is set equal to the resistance of the resistor R22. The first transistor N6 is an NMOS, and the third transistor N5 and the first transistor N6 are set to have the same element constants such as a threshold voltage. As a result, the potential V1 takes a value that a potential difference between the first potential Vn and the second potential Vdd1 is equally divided.

The differential amplifier 23a includes a differential pair formed of NMOSs N2 and N3 and a current mirror formed of PMOSs P1 and P2. A second transistor N4 is an NMOS forming a current mirror with the first transistor N6 of the divider 20, and supplies a constant current to the differential pair of the NMOSs N2 and N3.

Namely, the second potential Vdd1 is supplied to the source of the PMOS P1, the gate is connected to the gate of the PMOS P2, and the drain is connected to the drain of the NMOS N2. The second potential Vdd1 is supplied to the source of the PMOS P2, and the gate is connected to the drain of the PMOS P2 and the drain of the NMOS N3. The source of the NMOS N2 and the source of the NMOS N3 are connected to the drain of the second transistor N4. The gate of the NMOS N2 is connected to the connection point 22, and the potential V1 divided at the divider 20a is inputted to the gate of the NMOS N2. A ground potential of 0 V is inputted as a reference potential Vref to the gate of the NMOS N3. The gate of the second transistor N4 is connected to the drain of the first transistor N6 of the divider 20a, and the source is connected to the low-potential supply terminal 9a.

The differential amplifier 23a amplifies a potential difference between the potential V1 and the reference potential Vref (=0), and outputs the potential difference to the drain of the NMOS N2. The output of the differential amplifier 23a, that is, the drain potential of the NMOS N2 is inputted to the source follower 24.

The first potential controller 10a operates as a current output type voltage follower, and controls the first potential Vn of the low-potential supply terminal 9a to be Vn=−Vdd1 because the impedances of the dividing elements B1a and B2a are equal.

It is noted that desirably, the second potential Vdd1 is made equal to the absolute value of the first potential Vn at which the third-order harmonic distortion is the lowest. For example, when the second potential Vdd1 is set to 1.4 V, the first potential Vn is −1.4 V, which is the optimum value for the GSM standard.

In this embodiment, the divider 20a is used for the bias circuit of the amplifier 21a, and the second transistor N4 forming a current mirror with the first transistor N6 generates a constant current for the amplifier 21a. As a result, it is possible to reduce unnecessary layout areas because it is unnecessary to separately provide a bias circuit, and it is possible to reduce a bias current carried through a first potential generator 7.

The first potential controller 10a always operates for stabilizing the first potential Vn, and a current is carried through a second potential generator 11 and the first potential generator 7. For example, it is likely that a first potential generator using a charge pump includes a low current supply capacity, and even a bias current will be a burden on the first potential generator. However, the first potential controller 10a can reduce a bias current carried through the first potential generator 7, so that it is possible to reduce the possibility of an increase in power consumption or the occurrence of noise.

When the impedances of the dividing elements B1a and B2a are reduced and a response to the fluctuations of the first potential Vn is made fast, a bias current is increased and the burden on the first potential generator 7 is increased. However, in this embodiment, the third transistor N5 and the first transistor N6 are respectively provided for the dividing elements B1a and B2a of the divider 20a, a voltage across each of the resistors R21 and R22 can be reduced. As a result, it is possible to reduce the power consumption of the divider 20a, to about 1 μA, for example, and a burden will not be given to a charge pump 17 of the first potential generator 7.

The effect other than the aforementioned effect is the same as the effect of the first embodiment.

Third Embodiment

Next, a third embodiment will be described.

Figure 11:
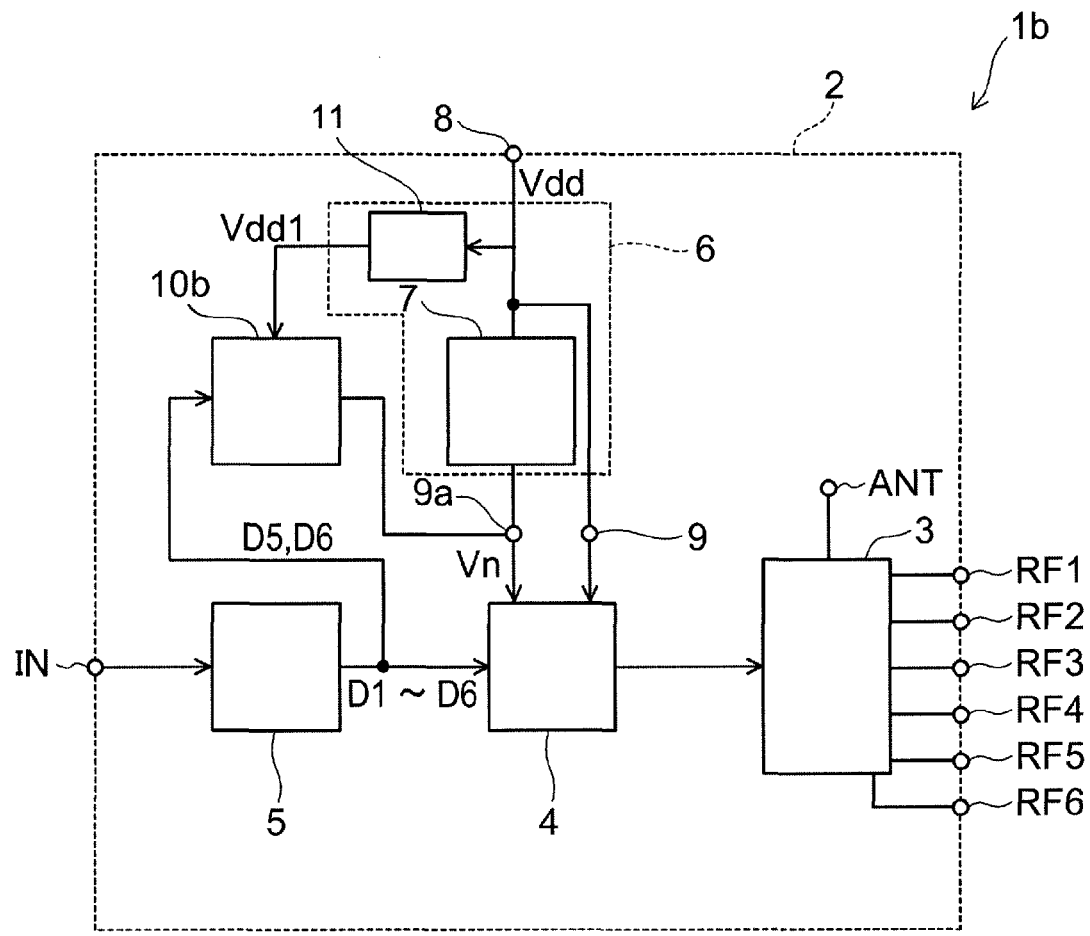
FIG. 11 is a block diagram illustrating a semiconductor switch according to a third embodiment.

FIG. 11 is a block diagram illustrating a semiconductor switch according to the third embodiment.

Figure 12:
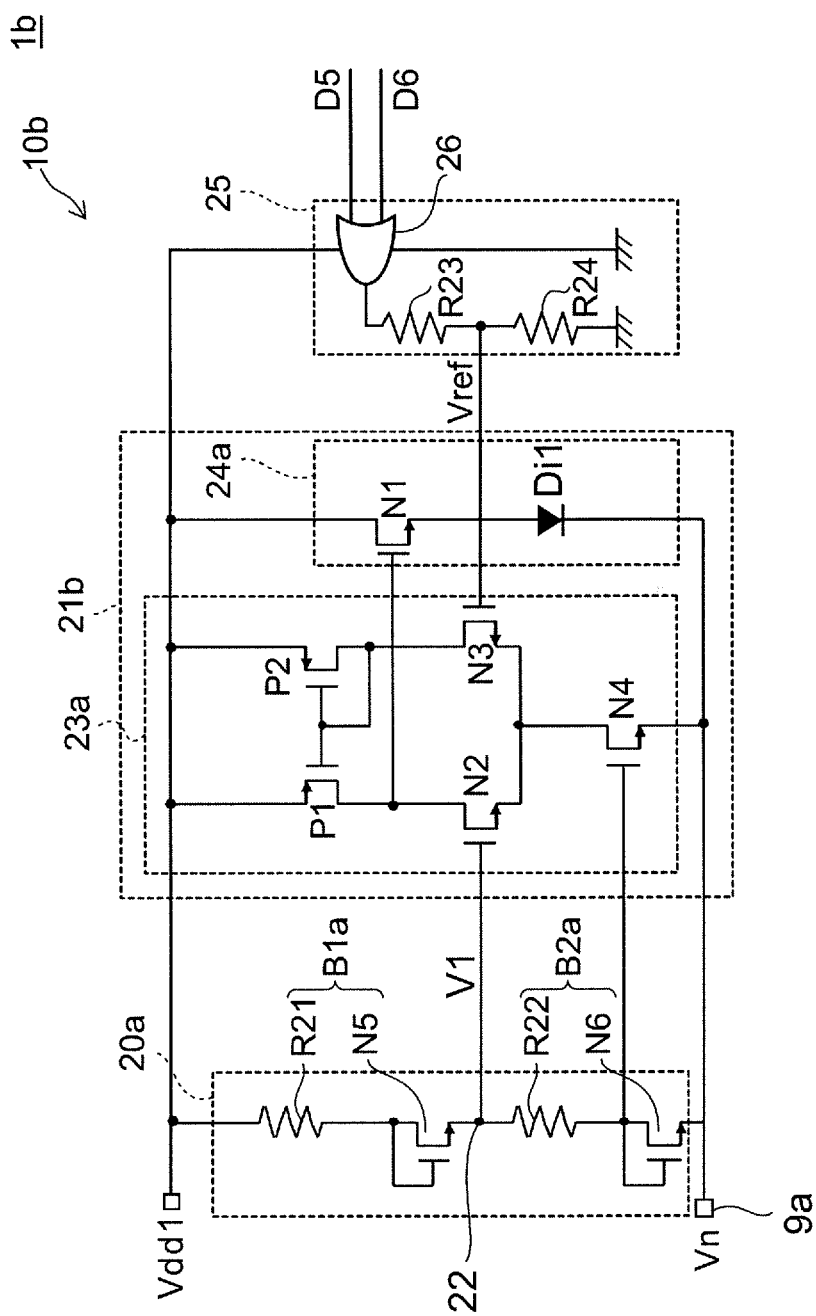
FIG. 12 is a circuit diagram illustrating a first potential controller according to the third embodiment.

FIG. 12 is a circuit diagram illustrating a first potential controller according to the third embodiment.

This embodiment is different from the aforementioned first and second embodiment in the configuration of the first potential controller. Namely, in this embodiment, a first potential controller 10b is provided instead of the aforementioned first potential controller 10a according to the second embodiment. The configurations other than the configuration of the first potential controller 10b of the semiconductor switch 1b according to this embodiment are the same as the configurations of the semiconductor switch 1a according to the second embodiment. It is noted that radio frequency terminals RF1 to RF4 are set to the GSM standard and radio frequency terminals RF5 and RF6 are set to the UMTS standard.

The first potential controller 10b is different from the first potential controller 10a according to the second embodiment in the configurations of the amplifier 21a and the source follower 24. Namely, in the first potential controller 10b, a source follower (a portion surrounded by a broken line 24a) is provided instead of the source follower 24, and an amplifier 21b is formed of a differential amplifier 23a and the source follower 24a.

The first potential controller 10b is additionally provided with a reference potential generator (a portion surrounded by a broken line 25). Signals D5 and D6 that a terminal switching signal IN is decoded are inputted to the reference potential generator 25 through interface 5.

The source follower 24a is different from the source follower 24 according to the second embodiment in that the diode Di2 is eliminated. Namely, in the source follower 24a, a diode Di1 for level-shifting is connected between the source of an NMOS N1 and a low-potential supply terminal 9a. Since the first potential controller 10b has a configuration in which a reference potential Vref is changed according to the terminal switching signal IN, the source follower 24a is formed of the diode Di1 for level-shifting.

The reference potential generator 25 includes an OR circuit (OR) 26 that generates a logical OR between the decode signals D5 and D6 and dividing resistors R23 and R24 that divide the output potential of the OR 26 and generate the reference potential Vref. It is noted that the dividing resistors R23 and R24 are the same type of resistors, and the dividing ratio is not affected by the fluctuations of the resistance caused by variations in the manufacturing processes or temperature.

The OR 26 is supplied with a second potential Vdd1 as a power supply potential and a ground potential of 0 V. When at least one of the decode signals D5 and D6o is at high level, that is, the radio frequency terminal RF5 or RF6 according to the UMTS standard is selected, the OR 26 outputs the second potential Vdd1 for high level. At this time, the dividing resistors R23 and R24 output a potential that the second potential Vdd1 is divided as the reference potential Vref. Since the second potential Vdd1 is stabilized at a constant voltage, the reference potential Vref is not affected by variations in the manufacturing processes or temperature.

When both of the decode signals D5 and D6 are at low level, that is, the radio frequency terminals RF1 to RF4 according to the GSM standard are selected, the OR 26 outputs a ground potential of 0 V for low level. In this output, the dividing resistors R23 and R24 output a ground potential of 0 V as the reference potential Vref.

The first potential Vn is Vn=−Vdd1+2×Vref. For example, suppose that the second potential Vdd1 is 1.4 V similarly as described above, the first potential Vn is −0.8 V, which is the optimum for the UMTS standard, where the reference potential Vref is 0.3 V. The first potential Vn is −1.4 V, where the reference potential Vref is a ground potential of 0 V.

Therefore, the first potential Vn is −1.4 V when the radio frequency terminals RF1 to RF4 according to the GSM standard are selected, and the first potential Vn is −0.8 V when the radio frequency terminals RF5 and RF6 according to the UMTS standard are selected.

In this embodiment, the first potential Vn is set to the optimum value of the communication method for high-frequency signals according to the terminal switching signal IN. As a result, it is possible to suppress an increase in the third-order harmonic distortion for improving radio frequency characteristics.

The effect other than the aforementioned effect is the same as the effect of the first embodiment.

Fourth Embodiment

Next, a fourth embodiment will be described.

Figure 13:
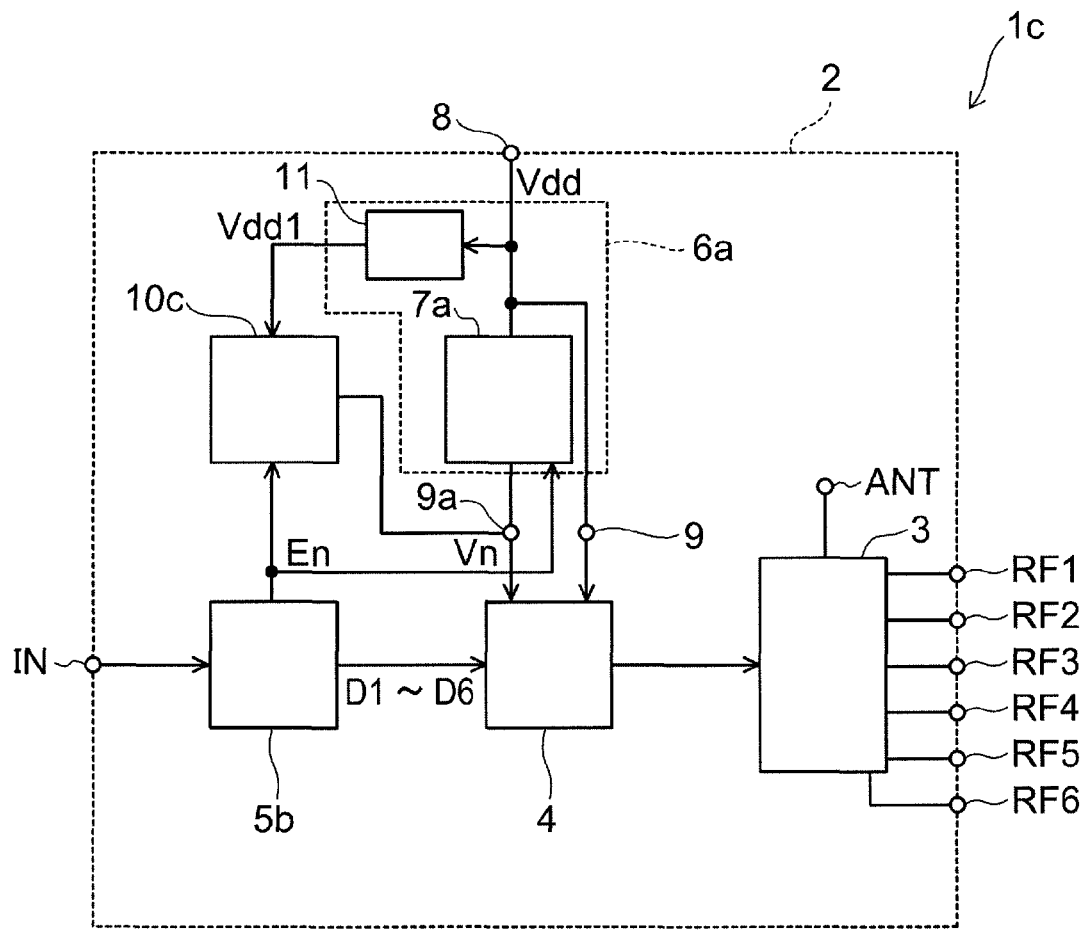
FIG. 13 is a block diagram illustrating a semiconductor switch according to a fourth embodiment.

FIG. 13 is a block diagram illustrating a semiconductor switch according to the fourth embodiment.

As illustrated in FIG. 13, the fourth embodiment is different from the first embodiment in the configurations of the interface 5, the power supply 6, and the first potential controller 10. Namely, in the fourth embodiment, an interface 5b, a power supply (a portion surrounded by a broken line 6a), and a first potential controller 10c are provided instead of the interface 5, the power supply 6, and the first potential controller 10 according to the first embodiment. A switch section 3 and a driver 4 are the same as those in the first embodiment.

A semiconductor switch 1c has the function of a normal operation mode that similarly operates as in the first to third embodiment and the function of a sleep mode in which the current supply capacity of the power supply 6a to supply a first potential Vn is smaller than the current supply capacity in the normal operation mode.

Figure 14:
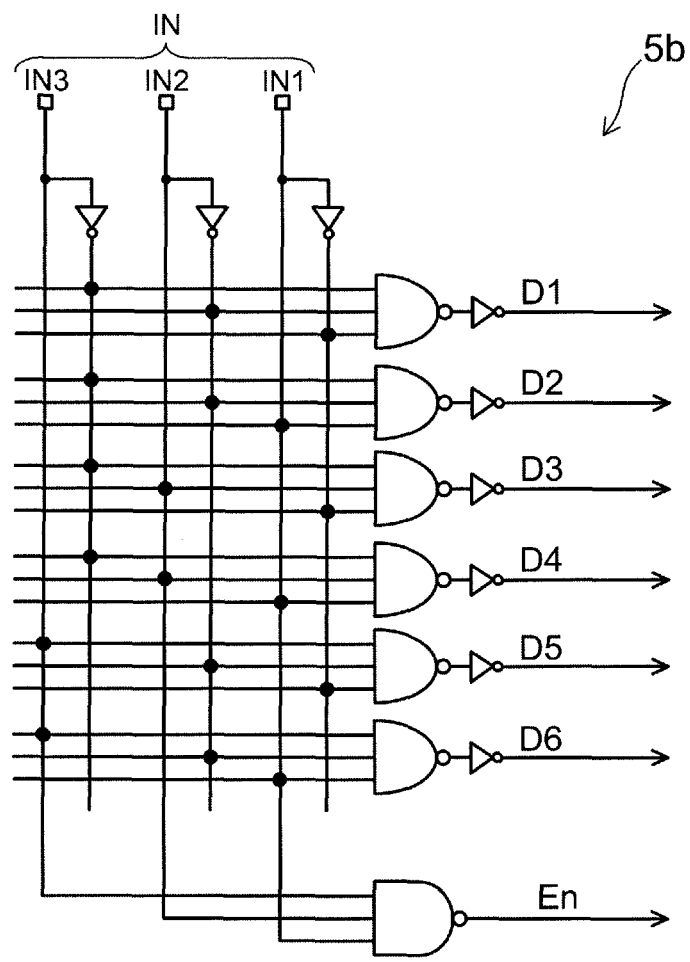
FIG. 14 is a circuit diagram illustrating an interface according to the fourth embodiment.

FIG. 14 is a circuit diagram illustrating an interface according to the fourth embodiment.

As illustrated in FIG. 14, the interface 5b decodes a terminal switching signal IN externally inputted, outputs decoded signals D1 to D6 to the driver 4, and outputs a mode signal En to the first potential controller 10c and the power supply 6a. The signals D1 to D6 are the same as those in the first embodiment, and are signals that switch the connection between a common terminal ANT and a plurality of radio frequency terminals RF1 to RF6 in the switch section 3. The mode signal En is a signal that switches the semiconductor switch 1c between the normal operation mode and the sleep mode, and is turned at high level in the normal operation mode and at low level in the sleep mode.

It is noted that although the interface 5b decodes the mode signal En which switches between the normal operation mode and the sleep mode from three bits of the terminal switching signal IN, one bit of the mode signal En independent of the terminal switching signal IN may be inputted. The configuration of the interface 5b is illustrated in the case where the terminal switching signal IN is parallel signals. However, a similar configuration can be provided also in the case of serial signals.

A power supply potential Vdd is supplied to the interface 5b. However, a second potential Vdd1 may be supplied as a power supply potential to the interface 5b depending on the potential of the terminal switching signal IN.

The power supply 6a includes a first potential generator 7a that generates a negative first potential Vn from the power supply potential Vdd and a second potential generator 11 that generates the second potential Vdd1 which the power supply potential Vdd is stepped down. The first potential Vn is supplied from the power supply 6a provided on an SOI substrate 2 to the driver 4 through a low-potential supply terminal 9a. The second potential Vdd1 is supplied as power for an internal circuit to the first potential controller 10c. It is noted that the second potential generator 11 is the same as the second potential generator 11 according to the first embodiment.

Figure 15:
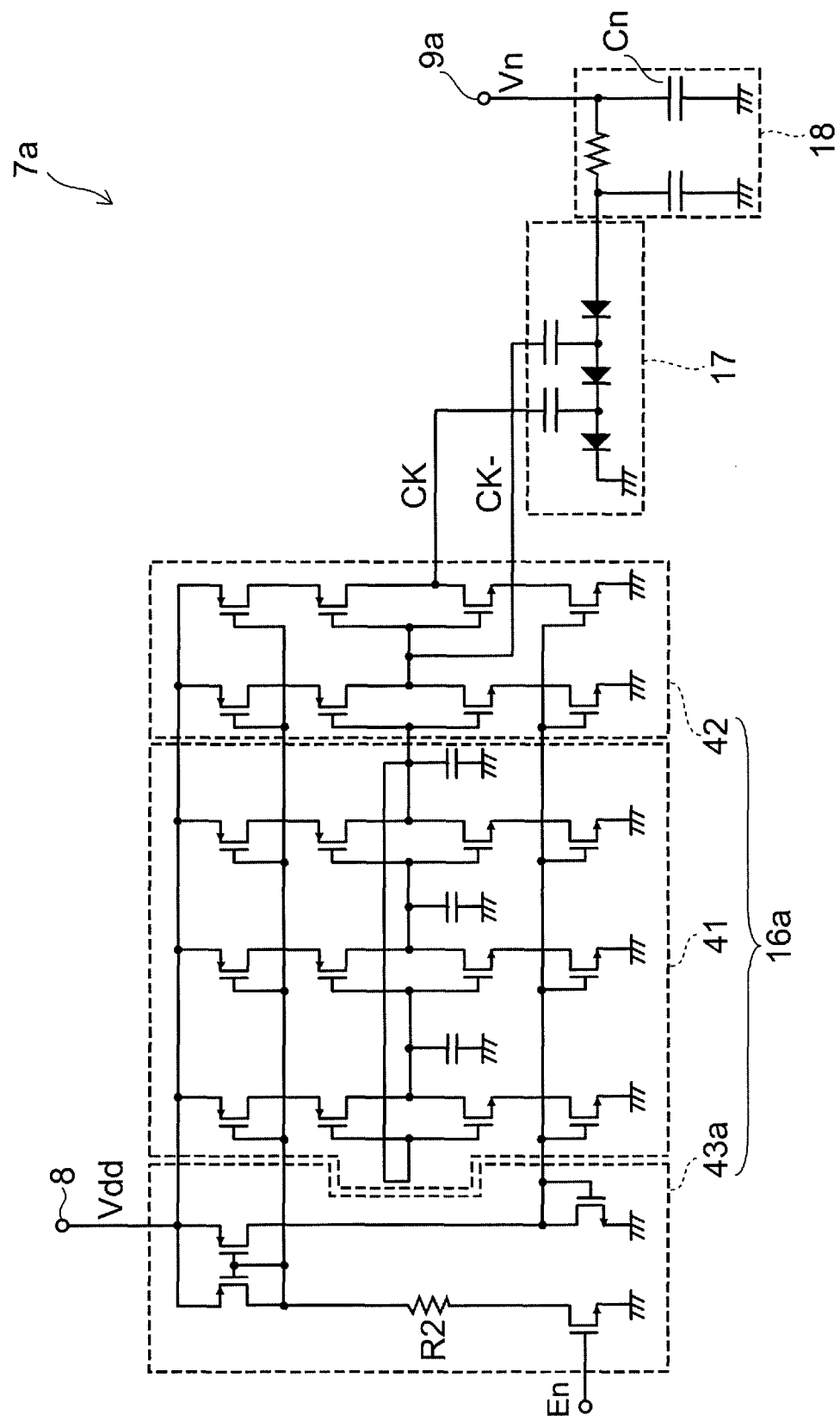
FIG. 15 is a circuit diagram illustrating a first potential generator according to the fourth embodiment.

FIG. 15 is a circuit diagram illustrating a first potential generator according to the fourth embodiment.

The first potential generator 7a is different from the first potential generator 7 according to the first embodiment in that the first potential generator 7a is provided with an oscillator 16a having a bias circuit 43a instead of the oscillator 16 having the bias circuit 43. A charge pump 17, a lowpass filter 18, a ring oscillator 41, and an output buffer 42 are the same as those in the first embodiment.

The bias circuit 43a receives the mode signal En decoded at the interface 5a, and supplies a bias to the ring oscillator 41 and the output buffer 42 when the mode signal En is at high level, that is, in the normal operation mode. The bias circuit 43a blocks a bias current when the mode signal En is at low level, that is, in the sleep mode, and stops the oscillation of the ring oscillator 41. It is noted that a resistor R2 of the bias circuit 43a regulates a current carried through the ring oscillator 41 and the output buffer 42 in the normal operation mode.

In the first potential generator 7a, the oscillator 16a stops the oscillation in the sleep mode, so that the charge pump 17 stops the operation, and does not generate the first potential Vn. As a result, the power consumption of the first potential generator 7a is suppressed. An output capacitor Cn of the lowpass filter 18 is charged at the first potential Vn. As a result, the output capacitor Cn is discharged when a leakage current is carried between the low-potential supply terminal 9a and the ground, and the first potential Vn is increased and brought close to a ground potential.

Figure 16:
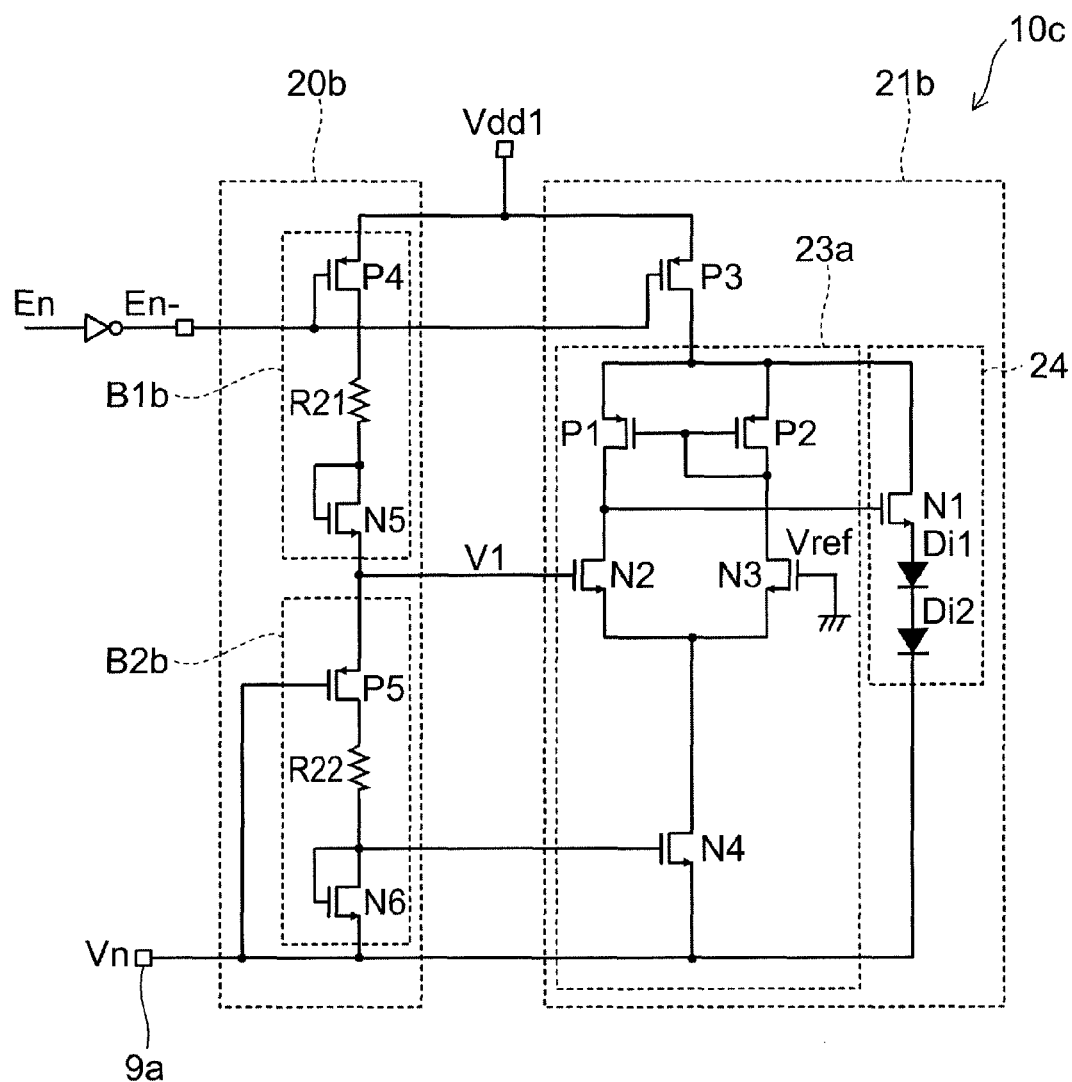
FIG. 16 is a circuit diagram illustrating a first potential controller according to the fourth embodiment.

FIG. 16 is a circuit diagram illustrating a first potential controller according to the fourth embodiment.

As illustrated in FIG. 16, the first potential controller 10c is different from the first potential controller 10a according to the second embodiment in the configurations of the divider 20a and the amplifier 21a. Namely, the first potential controller 10c is provided with a divider (a portion surrounded by a broken line 20b) in which a current is blocked in the sleep mode, instead of the divider 20a. An amplifier 21b is provided in which a blocking transistor P3 is additionally provided in the amplifier 21a to block the currents of the differential amplifier 23a and the source follower 24 in the sleep mode.

The gate of the blocking transistor P3 receives a signal En− that the mode signal En is inverted at an inverter.

In the divider 20b, dividing elements B1b and B2b are provided instead of the dividing elements B1a and B2a of the divider 20a. The dividing elements B1b and B2b are configured in which blocking transistors P4 and PMOS P5 are additionally provided for the dividing elements B1a and B2a, respectively.

The blocking transistor P4 is inserted in series in the dividing element B1b. The gate of the blocking transistor P4 receives a signal En− that the mode signal En is inverted at an inverter. The PMOS P5 is inserted in series in the dividing element B2b. The first potential Vn is supplied to the gate of the PMOS P5. It is noted that the blocking transistors P3 and P4 are a PMOS, and the PMOS P5 is an element that makes a pair, having electric characteristics matched with the electric characteristics of the blocking transistors P3 and P4.

The PMOS P5 is provided for making the impedances of the dividing elements B1b and B2b equal.

When the mode signal En is at high level, that is, in the normal operation mode, the blocking transistors P3 and P4 are turned on. The PMOS P5 is turned on when the first potential generator 7a generates the first potential Vn. As a result, a current is carried through the divider 20b having a first transistor N6, and a potential V1 that a potential difference between the second potential Vdd1 and the first potential Vn is divided is outputted to the connection point between the dividing elements B1b and B2b. A current is carried through the amplifier 21b having a second transistor N4, and the first potential Vn is stabilized at Vn=−Vdd1 with respect to a reference potential Vref (=0).

When the mode signal En is at low level, that is, in the sleep mode, the blocking transistors P3 and P4 are turned off. As a result, the current of the divider 20b having the first transistor N6 and the current of the amplifier 21b having the second transistor N4 are blocked. Namely, in the first potential controller 10c, the supply of the second potential Vdd1 is blocked, a state across the low-potential supply terminal 9a and the first potential controller 10c is turned into a high impedance stat, and a leakage current is suppressed.

In this embodiment, in the sleep mode, the oscillator 16a of the first potential generator 7a stops oscillation for stopping the generation of the first potential Vn. As a result, it is possible to reduce power consumption. In this embodiment, in the sleep mode, the supply of the second potential Vdd1 is blocked in the first potential controller 10c, and the first potential controller 10c connected to the low-potential supply terminal 9a is turned into a high impedance state. As a result, a leakage current is suppressed, and the first potential Vn is kept at a potential value in the normal operation mode immediately before by the output capacitor Cn. Thus, it is possible to reduce a period (wake-up time) to almost zero, which is necessary for the first potential Vn to reach a stationary value in switching the mode from the sleep mode to the normal operation mode.

The operation of the normal operation mode in this embodiment is the same as that in the second embodiment, and the effect of this embodiment other than the effect described above is the same as the effect of the second embodiment.

Fifth Embodiment

Next, a fifth embodiment will be described.

Figure 17:
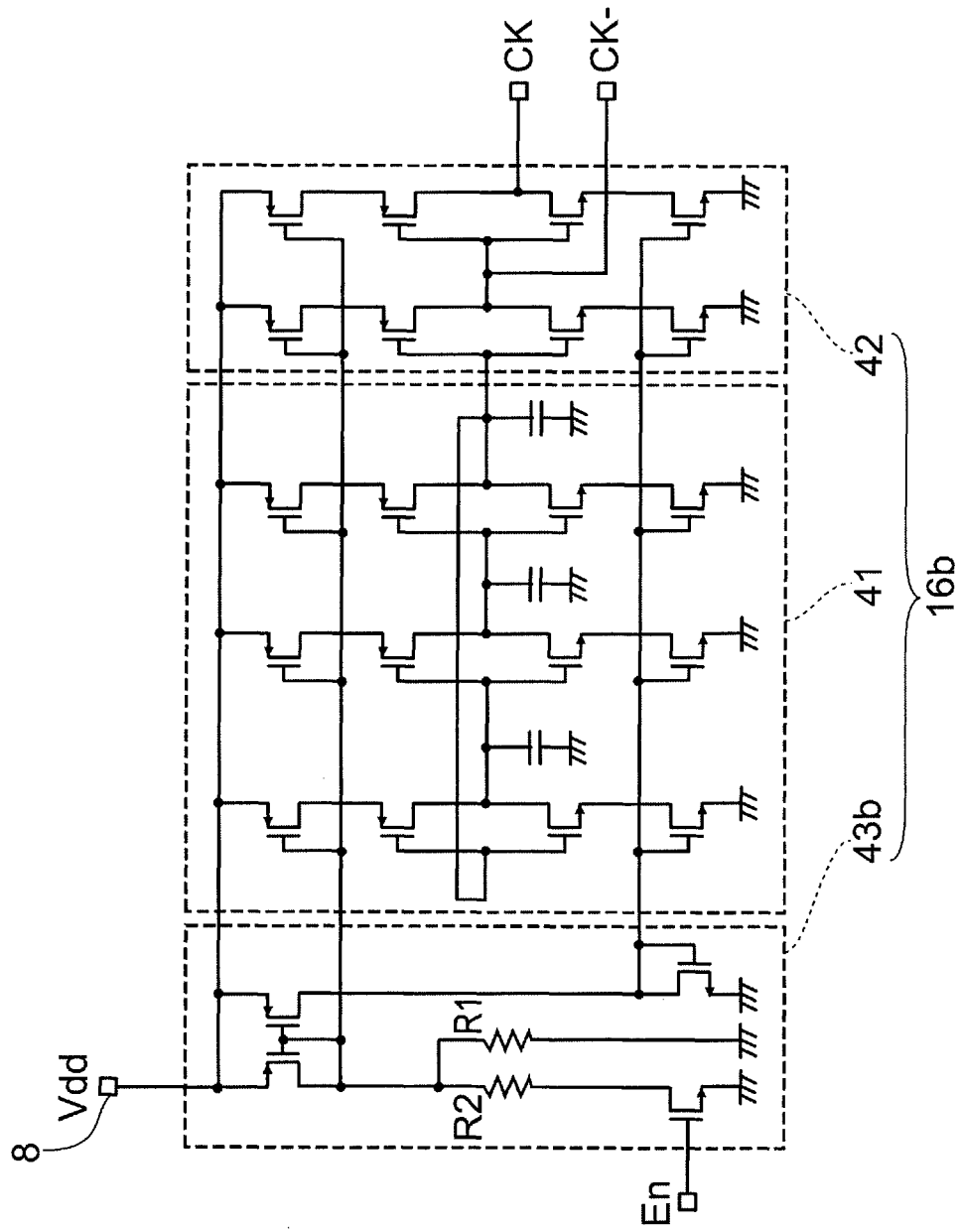
FIG. 17 is a circuit diagram illustrating an oscillator of a first potential generator according to a fifth embodiment.

FIG. 17 is a circuit diagram illustrating an oscillator of a first potential generator according to the fifth embodiment.

As illustrated in FIG. 17, the fifth embodiment is different from the fourth embodiment in the configurations of the oscillator 16a of the first potential generator 7a. Namely, an oscillator 16b is provided with a bias circuit 43b instead of the bias circuit 43a of the oscillator 16a. The configurations of the fifth embodiment are the same as the configurations of the fourth embodiment other than this configuration.

The bias circuit 43b is additionally provided with a resistor R1 having a resistance larger than the resistance of a resistor R2 in the bias circuit 43a. The bias circuit 43b switches the current values of a ring oscillator 41 and an output buffer 42 between the normal operation mode and the sleep mode according to a mode signal En. Namely, the bias circuit 43b carries a current regulated by a resultant resistance, which the resistors R1 and R2 are connected in parallel, to the ring oscillator 41 and the output buffer 42 in the normal operation mode. The bias circuit 43b carries a current regulated by the resistor R1 to the ring oscillator 41 and the output buffer 42 in the sleep mode. For example, the bias circuit 43b reduces a current in the sleep mode to about one-tenth of the current in the normal operation mode. As a result, the current supply capacity of the first potential generator in the sleep mode is smaller than the current supply capacity in the normal operation mode.

In this embodiment, as compared with the case where the first potential generator stops the operation in the sleep mode, power consumption is increased in the sleep mode. However, in this embodiment, a reduction in the first potential Vn can be compensated with respect to the leakage current (the leakage path) of the low-potential supply terminal 9a, which is a little left, even though the first potential controller 10c is turned into a high impedance state. Namely, the discharge of an output capacitor Cn due to a leakage current can be compensated, even though an extremely long time, one second, for example, elapses. As a result, it is possible to shorten wake-up time to almost zero in the case where the mode is in the sleep mode for a long time and then switched to the normal operation mode.

The operation of the normal operation mode in this embodiment is the same as that in the second embodiment, and the effect of this embodiment other than the effect described above is the same as the effect of the second embodiment.

Sixth Embodiment

Next, a sixth embodiment will be described.

Figure 18:
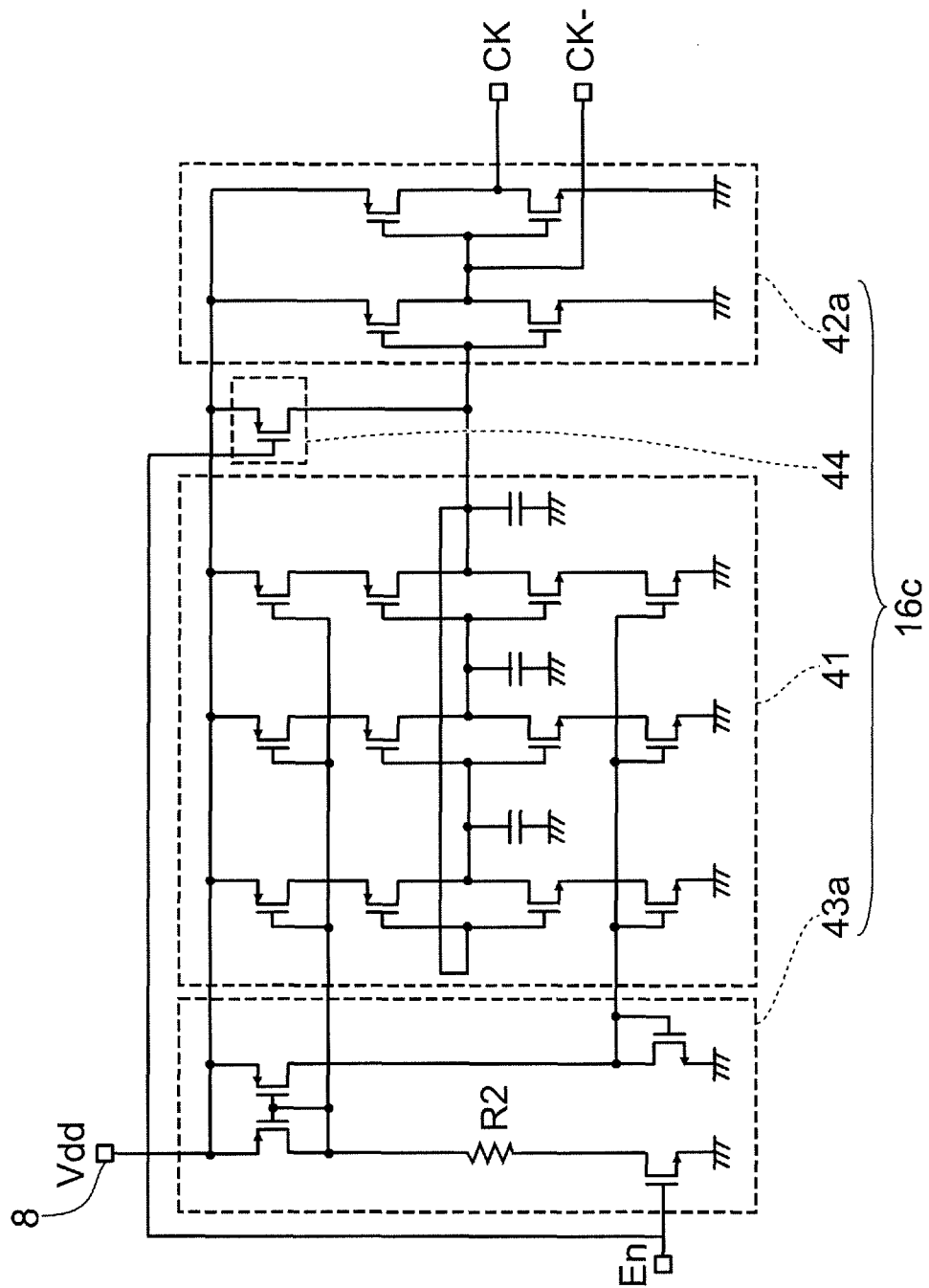
FIG. 18 is a circuit diagram illustrating an oscillator of a first potential generator according to a sixth embodiment.

FIG. 18 is a circuit diagram illustrating an oscillator of a first potential generator according to the sixth embodiment.

As illustrated in FIG. 18, the sixth embodiment is different from the fourth embodiment in the configuration of the oscillator 16a of the first potential generator 7a. Namely, an oscillator 16c is provided with an output buffer 42a instead of the output buffer 42 of the oscillator 16a, and additionally provided with a potential holder 44 that holds the input of the output buffer 42a at high level in the sleep mode. The configurations of the sixth embodiment are the same as the configurations of the fourth embodiment other than this configuration.

The output buffer 42a is different from the output buffer 42 of the oscillator 16a in that the output buffer 42a is directly connected to a power supply in which a current is not controlled by a bias circuit 43a. Namely, the output buffer 42 was configured in a current control type that a current can be controlled by the bias circuit 43a. On the contrary, since the output buffer 42a in this embodiment is configured of one directly connected to a power supply, the output buffer 42a has a high current supply capacity, and can shorten a period (start-up time) that a first potential Vn reaches a stationary value after turning on the power supply.

The potential holder 44 pulls up the input of the output buffer 42a in the sleep mode. Since the output of the ring oscillator 41 is turned into a high impedance state in the sleep mode and the output potential becomes unsteady, the input of the output buffer 42a is stabilized by the potential holder 44. As a result, the input of the output buffer 42a is fixed at high level for preventing a cross current from being carried through the output buffer 42a. It is noted that the potential holder 44 in this embodiment is a PMOS, and a mode signal En is inputted to the gate. However, it is sufficient that the potential holder can fix the input of the output buffer 42a at high level or low level in the sleep mode. The input of the output buffer 42a may be pulled down using an NMOS or the like. In this embodiment, the configuration is illustrated in which the oscillator 16*c* includes the bias circuit 43*a*. However, the bias circuit 43*b* may be provided instead of the bias circuit 43*a*.

The effect of this embodiment other than the aforementioned effect is the same as the effect of the second embodiment.

Seventh Embodiment

Next, a seventh embodiment will be described.

Figure 19:
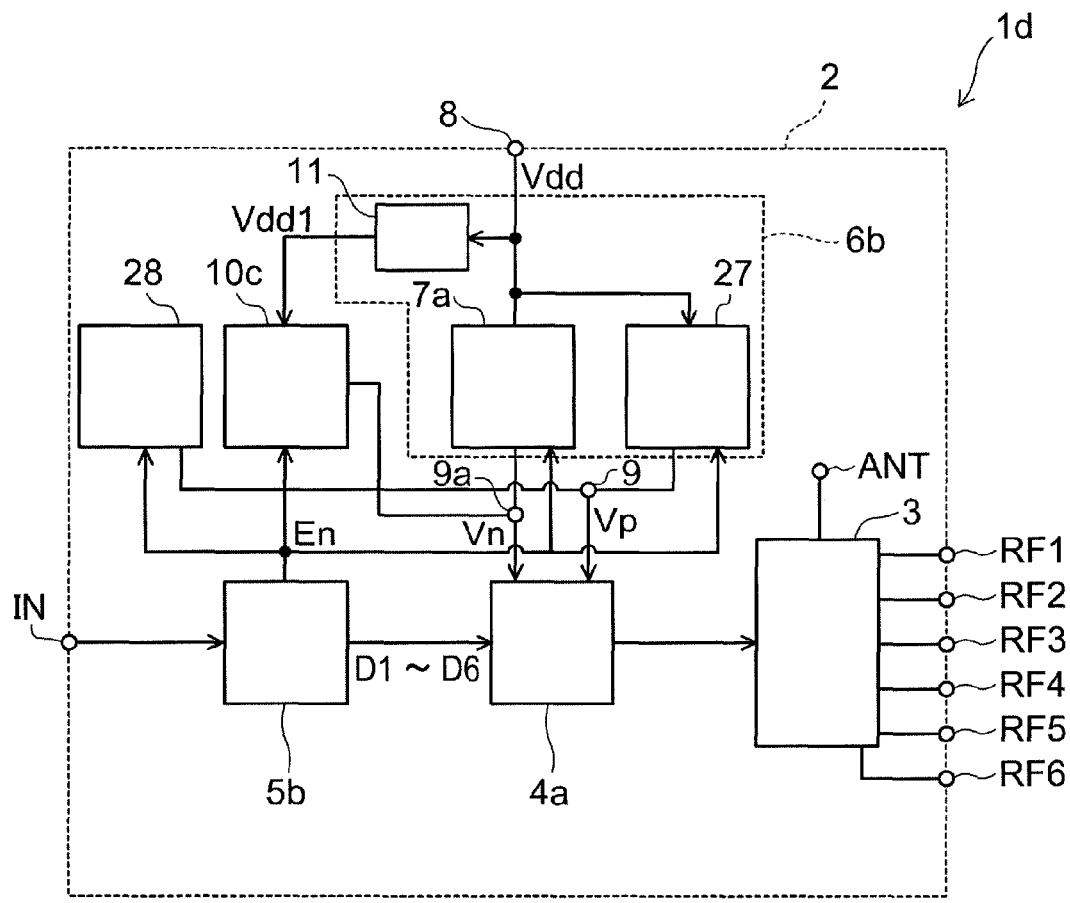
FIG. 19 is a block diagram illustrating a semiconductor switch according to a seventh embodiment.

FIG. 19 is a block diagram illustrating a semiconductor switch according to the seventh embodiment.

As illustrated in FIG. 19, the seventh embodiment is different from the fourth embodiment in the configurations of the driver 4 and the power supply 6*a*, and different in that a second potential controller 28 is additionally provided. Namely, in the seventh embodiment, a driver 4*a* and a power supply (a portion surrounded by a broken line 6*b*) are provided instead of the driver 4 and the power supply 6*a*. A switch section 3 and an interface 5*b* are the same as those in the fourth embodiment.

A semiconductor switch 1*d* has the function of the normal operation mode and the function of a sleep mode in which the current supply capacity of the power supply 6*b* to supply a first potential Vn and a third potential Vp is smaller than the current supply capacity in the normal operation mode.

The driver 4*a* is different from the driver 4 according to the first embodiment in that the third potential Vp is supplied as a positive power supply potential to a high-potential supply terminal 9.

Figure 20:
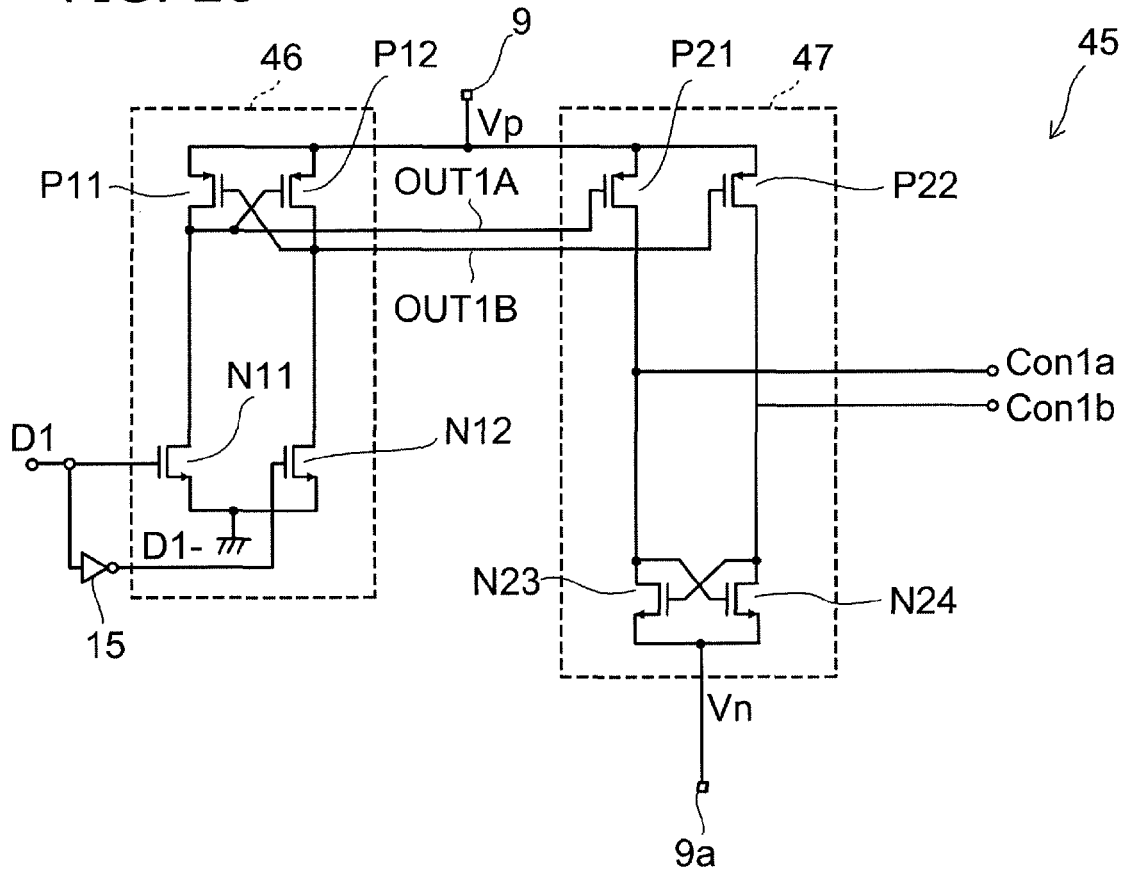
FIG. 20 is another circuit diagram illustrating a level shifter.

FIG. 20 is another circuit diagram illustrating a level shifter.

As illustrated in FIG. 20, a level shifter 45 is supplied with a positive third potential Vp through the high-potential supply terminal 9, and supplied with a negative first potential Vn through a low-potential supply terminal 9*a*. The driver 4*a* is formed of six level shifters having the same circuit as the circuit of the level shifter 45, for example; the six level shifters respectively receive decode signals D1 to D6, and output control signals Con1*a* and Con1*b* to Con6*a* and Con6*b*.

The level shifter 45 includes a first level shifter 46 and a second level shifter 47. The first level shifter 46 includes a pair of NMOSs N11 and N12 and a pair of PMOSs P11 and P12. The second level shifter 47 includes a pair of PMOSs P21 and P22 and a pair of NMOSs N23 and N24.

The sources of the NMOSs N11 and N12 are connected to a ground. The decode signal D1 is inputted to the gate of the NMOS N11. A signal D1− that the decode signal D1 is inverted is inputted to the gate of the NMOS N12 through an inverter 15.

The drains of the NMOSs N11 and N12 are connected to the drains of the PMOSs P11 and P12, respectively. The third potential Vp is supplied to the sources of the PMOSs P11 and P12 through the high-potential supply terminal 9. The gate of the PMOS P11 is connected to the drain of the PMOS P12, and the gate of the PMOS P11 and the drain of the PMOS P12 are connected to a line OUT1B, which is one of differential outputs of the first level shifter 46. The gate of the PMOS P12 is connected to the drain of the PMOS P11, and the gate of the PMOS P12 and the drain of the PMOS P11 are connected to a line OUT1A, which is the other differential output of the first level shifter 46.

The line OUT1A and the line OUT1B are connected to the gates of the PMOSs P21 and P22 of the second level shifter 47, respectively. The output of the first level shifter 46 is inputted to the second level shifter 47 through the line OUT1A and the line OUT1B. The first potential Vp is supplied to the sources of the PMOSs P21 and P22 through the high-potential supply terminal 9.

The drain of the PMOS P21 is connected to the drain of the NMOS N23, and the control signal Con1*a* is outputted from a connecting node therebetween. The drain of the PMOS P22 is connected to the drain of the NMOS N24, and the control signal Con1*b* is outputted from a connecting node therebetween. An ON-potential Von is supplied as the high-level potential of the control signals Con1*a* and Con1*b*, and an Off-potential Voff is supplied as the low-level potential to the gates of through FETs and shunt FETs of the switch section 3.

The first level shifter 46 outputs the decode signal D1, which the high level of input is at Vdd1 and the low level of input is at 0 V, as a differential signal, which the high level is at the third potential Vp and the low level is at 0 V (a ground potential). Namely, the high-level potential is converted into the third potential Vp. The second level shifter 47 outputs the output level thereof as a differential signal, which the high level is at the third potential Vp and the low level is at the first potential Vn. Namely, the low-level potential is converted into the first potential Vn.

The level shifter 45 outputs the decode signal D1, which the high level of input is at Vdd1 and the low level of input is at 0 V, as a differential signal, which the high level is at the third potential Vp and the low level is at the first potential Vn. Namely, the inputted high level potential and low-level potential are converted into the third potential Vp and the first potential Vn, respectively.

It is noted that it is sufficient for the level shifter 45 to level-shift the decode signal D1, which the high level is at Vdd1 and the low level is at 0 V, to the control signals Con2*a* and Con1*b*, which the high level is at the third potential Vp and the low level is at the first potential Vn. The level shifter 45 may not have the configuration illustrated in FIG. 20, and may have other configurations. The same thing is applied to the other level shifters, which level-shift the decode signal D2 to D6 and output the control signals Con2*a*, Con2*b* to Con6*a*, and Con6*b*.

Figure 21:
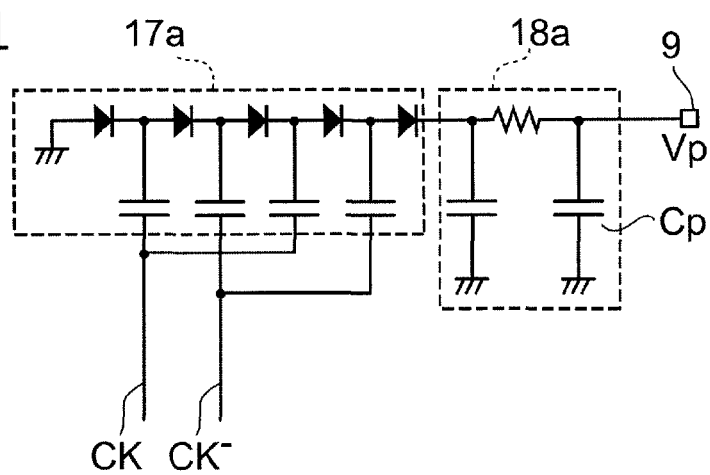
FIG. 21 is a circuit diagram illustrating a third potential generator according to the seventh embodiment.

FIG. 21 is a circuit diagram illustrating a third potential generator according to the seventh embodiment.

As illustrated in FIG. 21, a third potential generator 27 includes a charge pump 17*a* and a lowpass filter 18*a*. The lowpass filter 18*a* is the same as the lowpass filter 18 of the first potential generator 7*a* according to the fourth embodiment.

The charge pump 17*a* is different from the charge pump 17 of the first potential generator 7*a* in the orientation of diodes and the number of diodes. Namely, the charge pump 17*a* includes five diodes connected in series and four capacitors having one end thereof connected between the diodes. The anode side of the five diodes connected in series is grounded, and the cathode side is connected to the lowpass filter 18*a*. Differential clock signals CK and CK− are alternately supplied from an oscillator 16*a* to the other end of each of the capacitors. It is noted that the numbers of the diodes and the capacitors can be optional numbers according to a potential to be generated.

As similar to the first potential generator 7*a*, a positive potential is generated at the charge pump 17*a* because of the storage and movement of electric charges caused by the differential clock signals CK and CK−. The lowpass filter 18*a* is formed of a resistor and a capacitor, and removes output noise of the charge pump 17*a*. The terminal voltage of an output capacitor Cp of the lowpass filter 18*a* connected to the high-potential supply terminal 9 with respect to the ground is the third potential Vp. The power supply potential Vdd supplied from the power supply terminal 8 is 2.3 V, for example, and the third potential Vp is 3.4 V, for example.

Since the clock signals CK and CK– generated at an oscillator 16c of the first potential generator 7a are inputted to the third potential generator 27, the third potential generator 27 stops the generation of the third potential Vp in the sleep mode.

Figure 22:
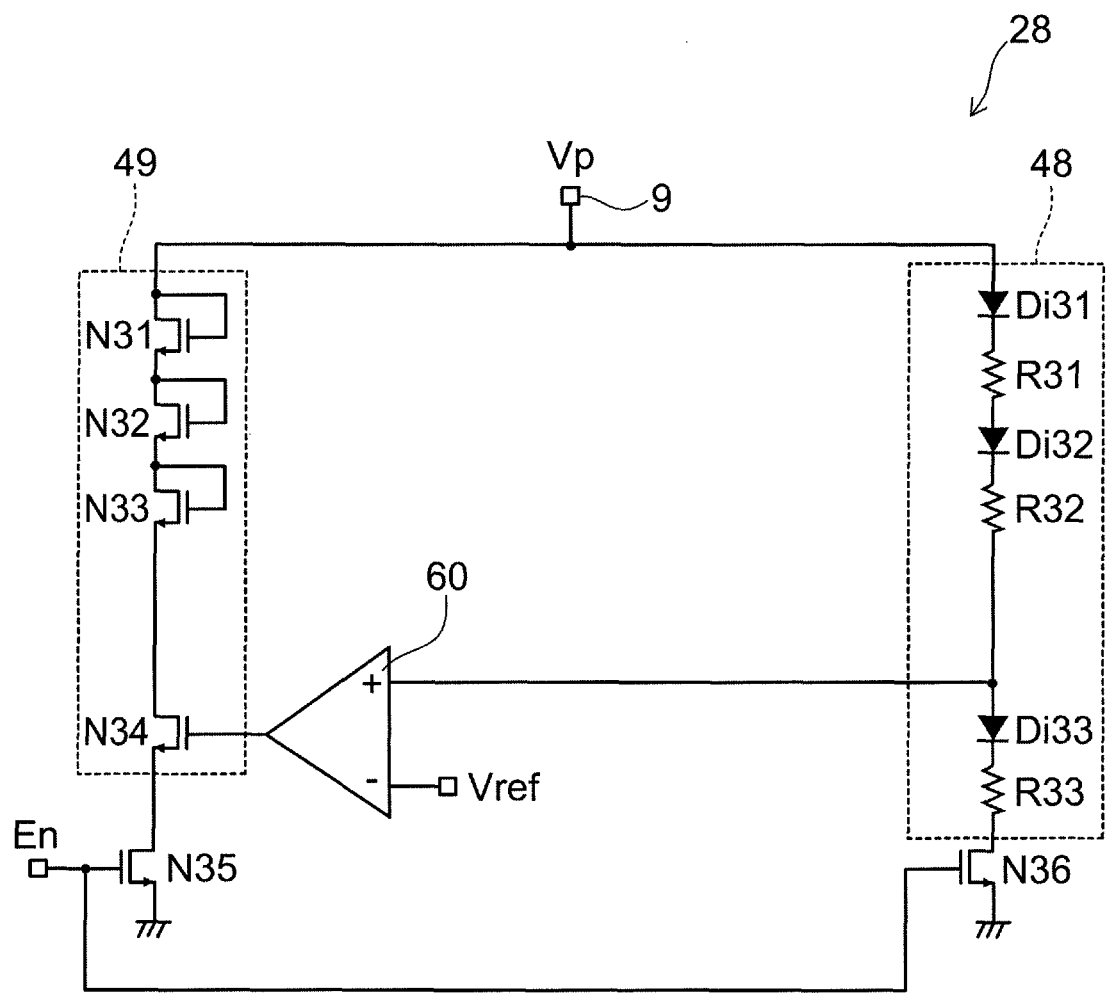
FIG. 22 is a circuit diagram illustrating a second potential controller according to the seventh embodiment.

FIG. 22 is a circuit diagram illustrating a second potential controller according to the seventh embodiment.

As illustrated in FIG. 22, the second potential controller 28 includes a divider 48 that divides the third potential Vp, a current controller 49 that controls a current between the high-potential supply terminal 9 and the ground, and an amplifier 60.

The divider 48 is connected between the high-potential supply terminal 9 and the ground through a blocking transistor N36, and includes resistors R31 to 33, diodes Di31 to Di33, and the blocking transistor N36. A plurality of units are connected to the blocking transistor N36 in series as the resistor and the diode connected in series are a single unit. Namely, the blocking transistor N36 and three units, a unit of the resistor R31 and the diode Di31 connected in series, a unit of the resistor R32 and the diode Di32 connected in series, and a unit of the resistor R33 and the diode Di33 connected in series, are connected between the high-potential supply terminal 9 and the ground. The potential of a unit of the resistor R33 and the diode Di 33 is inputted as a potential, which the third potential Vp is divided, to the non-inverting input terminal of the amplifier 60. It is noted that the resistance of each of the resistors R31 to R33 is set equal and the diodes Di31 to Di33 have matched electric characteristics.

The current controller 49 is connected between the high-potential supply terminal 9 and the ground GND through a blocking transistor N35, and includes NMOSs N31 to N34. The NMOSs N31 to N33 are diode-connected to each other, and connected to each other in series. The NMOS N34 is connected between the NMOSs N31 to N33 connected in series and the blocking transistor N35. The gate of the NMOS N34 is connected to the output of the amplifier 60, and the current of the NMOS N1 is controlled by the amplifier 60. The reference potential Vref is inputted to the inverting input terminal of the amplifier 60.

A mode signal En is inputted to the gates of the blocking transistors N35 and N36. In the normal operation mode, that is, when the mode signal En is at high level, the blocking transistors N35 and N36 are turned on.

Therefore, in the normal operation mode, the amplifier 60 controls the gate potential of the NMOS N34 in such a way that a potential, which the third potential Vp inputted to the non-inverting input terminal is divided, is made equal to the reference potential Vref, and controls a current carried through the current controller 49. As a result, the third potential Vp is stabilized to be Vp=3×Vref. For example, the third potential Vp is 3.42 V, where the reference potential Vref is 1.14 V. It is noted that the ON resistances of the blocking transistors N35 and N36 are sufficiently smaller than the resistances of the resistors R31 to R33.

In the sleep mode, that is, when the mode signal En is at low level, the blocking transistors N35 and N36 are turned off, and the second potential controller 28 connected to the high-potential supply terminal 9 is turned into a high impedance state. As a result, a current carried from the high-potential supply terminal 9 to the ground through the second potential controller 28 is blocked, and the leakage current of the high-potential supply terminal 9 is suppressed.

As described above, in the sleep mode, the first potential controller 10c connected to the low-potential supply terminal 9a is turned into a high impedance state. As a result, a current carried from the ground to the low-potential supply terminal 9a through the first potential controller 10c is blocked, and the leakage current of the low-potential supply terminal 9a is suppressed.

As described above, in this embodiment, the oscillator 16a of the first potential generator 7a stops oscillation in the sleep mode, and stops the generation of the first potential Vn and the third potential Vp. As a result, it is possible to reduce power consumption. In this embodiment, the first potential controller 10c connected to the low-potential supply terminal 9a and the second potential controller 28 connected to the high-potential supply terminal 9 are turned into a high impedance state in the sleep mode, and the leakage currents of the high-potential supply terminal 9 and the low-potential supply terminal 9a are suppressed. As a result, the first potential Vn and the third potential Vp are kept at the potential value in the normal operation mode immediately before by the output capacitors Cn and Cp, and it is possible to reduce a period (wake-up time) to almost zero, which is necessary for the first potential Vn and the third potential Vp to reach a stationary value in switching the mode from the sleep mode to the normal operation mode.

In this embodiment, the third potential Vp higher than the positive power supply potential Vdd supplied from the power supply terminal 8 is supplied to the high-potential supply terminal 9, so that it is possible to reduce the insertion loss of the switch section 3.

In this embodiment, the operation of the normal operation mode other than the operation described above is the same as the operation in the fourth embodiment, and the effect of this embodiment other than the effect described above is the same as the effect of the fourth embodiment.

It is noted that in this embodiment, the configuration is illustrated in which the oscillator 16a according to the fourth embodiment is used. However, the oscillator 16b according to the fifth embodiment or the oscillator 16c according to the sixth embodiment may be provided instead of the oscillator 16a.

Eighth Embodiment

Next, an eighth embodiment will be described.

Figure 23:
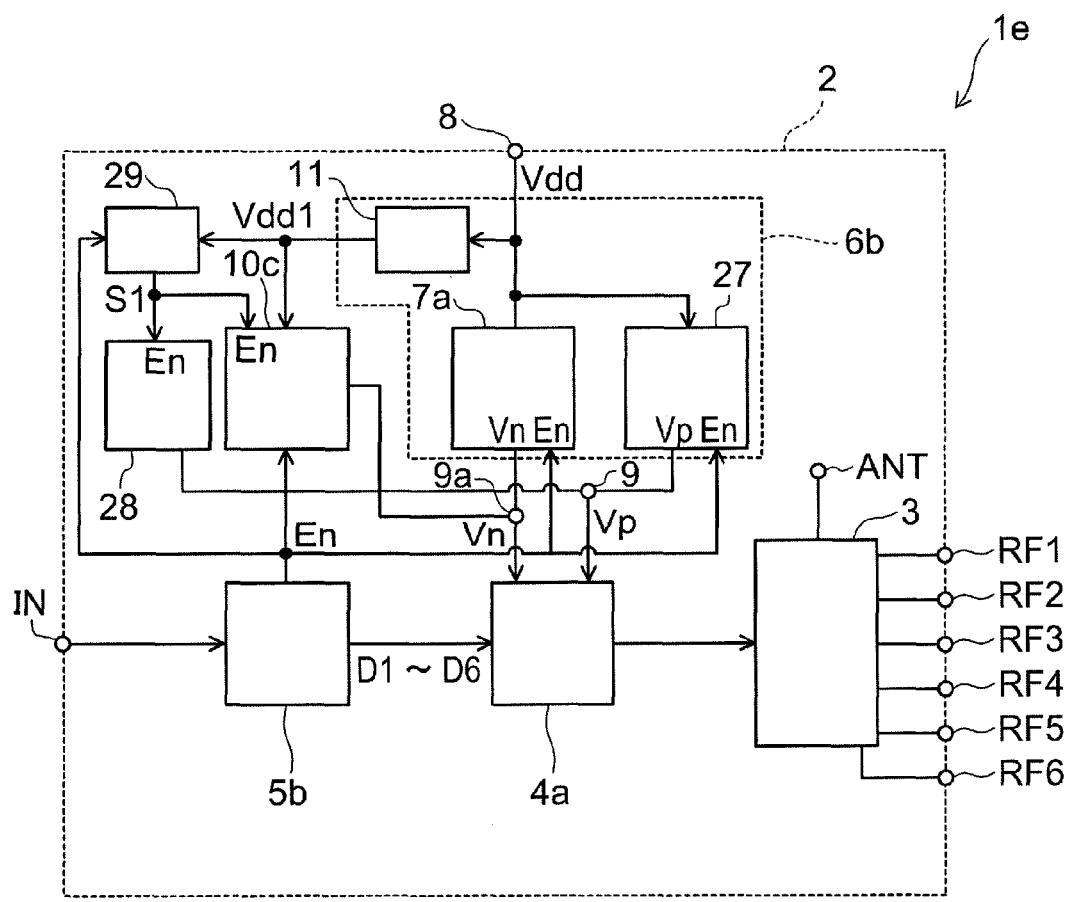
FIG. 23 is a block diagram illustrating a semiconductor switch according to a eighth embodiment.

FIG. 23 is a block diagram illustrating a semiconductor switch according to the eighth embodiment.

As illustrated in FIG. 23, the eighth embodiment is different from the seventh embodiment in that a power supply turning-on detector 29 is additionally provided. A switch section 3, a driver 4a, an interface 5b, a power supply 6b, a first potential controller 10c, and a second potential controller 28 are the same as those in the seventh embodiment.

A semiconductor switch 1e has the function of the normal operation mode and the function of a sleep mode in which the current supply capacity of the power supply 6b to supply a first potential Vn and a third potential Vp is smaller than the current supply capacity in the normal operation mode.

The power supply turning-on detector 29 is a circuit that receives a second potential Vdd1 generated at a second potential generator 11 to detect an event of turning on the power supply and outputs an output signal S1 that a mode signal En is masked when turning on the power supply. The output signal S1 of the power supply turning-on detector 29 is supplied to the first potential controller 10c and the second potential controller 28 as the mode signal En for the first potential controller 10c and the second potential controller 28.

Figure 24:
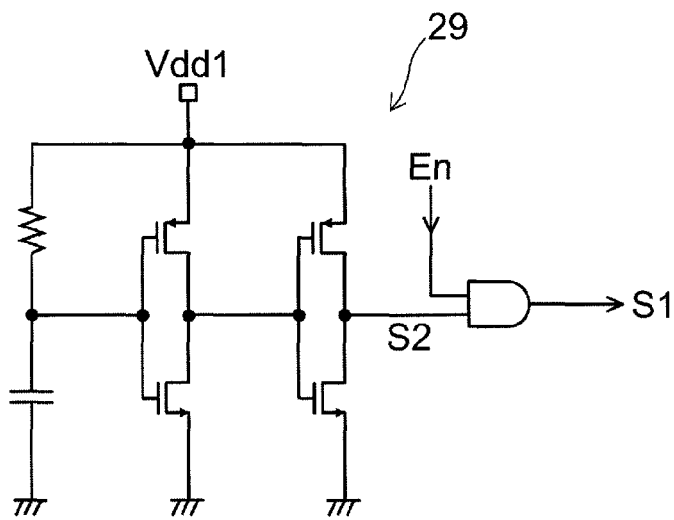
FIG. 24 is a circuit diagram illustrating a power supply turning-on detector according to the eighth embodiment.

FIG. 24 is a circuit diagram illustrating a power supply turning-on detector according to the eighth embodiment.

As illustrated in FIG. 24, the power supply turning-on detector 29 integrates the second potential Vdd1 with a resistor and a capacitor when turning on the power supply, and detects an event of turning on the power supply through a buffer formed of inverters in two stages. The power supply turning-on detector 29 then generates an AND between a power supply turning-on signal S2 and the mode signal En, and outputs the AND as the signal S1.

The power supply turning-on detector 29 outputs low level as the power supply turning-on signal S2 from immediately after turning on the power supply to time T1 that is determined by the time constants of the resistor and the capacitor, and outputs low level as the signal S1 regardless of the level of the mode signal En. The power supply turning-on detector 29 outputs high level as the power supply turning-on signal S2 after the time T1 from the event of turning on the power supply, and outputs the mode signal En as the signal S1.

It is noted that the power supply potential Vdd externally supplied to the power supply terminal 8 is likely to increase extremely gently when turning on the power supply, causing an increase in rise time. In this case, it is likely that the integrator formed of the resistor and the capacitor does not respond and cannot detect an event of turning on the power supply. On the contrary, since the rise time of the second potential Vdd1 is generally short, the integrator formed of the resistor and the capacitor can detect an event of turning on the power supply in response to the rising edge of the second potential Vdd1. Therefore, the power supply turning-on detector 29 integrates the rising edge of the second potential Vdd1 in order to detect an event of turning on the power supply.

As described above, in this embodiment, the output signal S1 of the power supply turning-on detector 29 is inputted as the mode signal En for the first potential controller 10c and the second potential controller 28. Since the signal S1 is at low level from immediately after turning on the power supply to the time T1, the first potential controller 10c and the second potential controller 28 are turned into a high impedance state, and a leakage current caused by these circuits will not occur. As a result, the time T1 is appropriately set, so that it is possible to suppress an increase in start-up time because of the provision of the first potential controller 10c and the second potential controller 28. It is noted that start-up time in this embodiment is time that the first potential Vn and the third potential Vp reach a predetermined value after turning on the power supply.

The effect of this embodiment other than the aforementioned effect is the same as the effect of the seventh embodiment.

Ninth Embodiment

Next, a ninth embodiment will be described.

Figure 25:
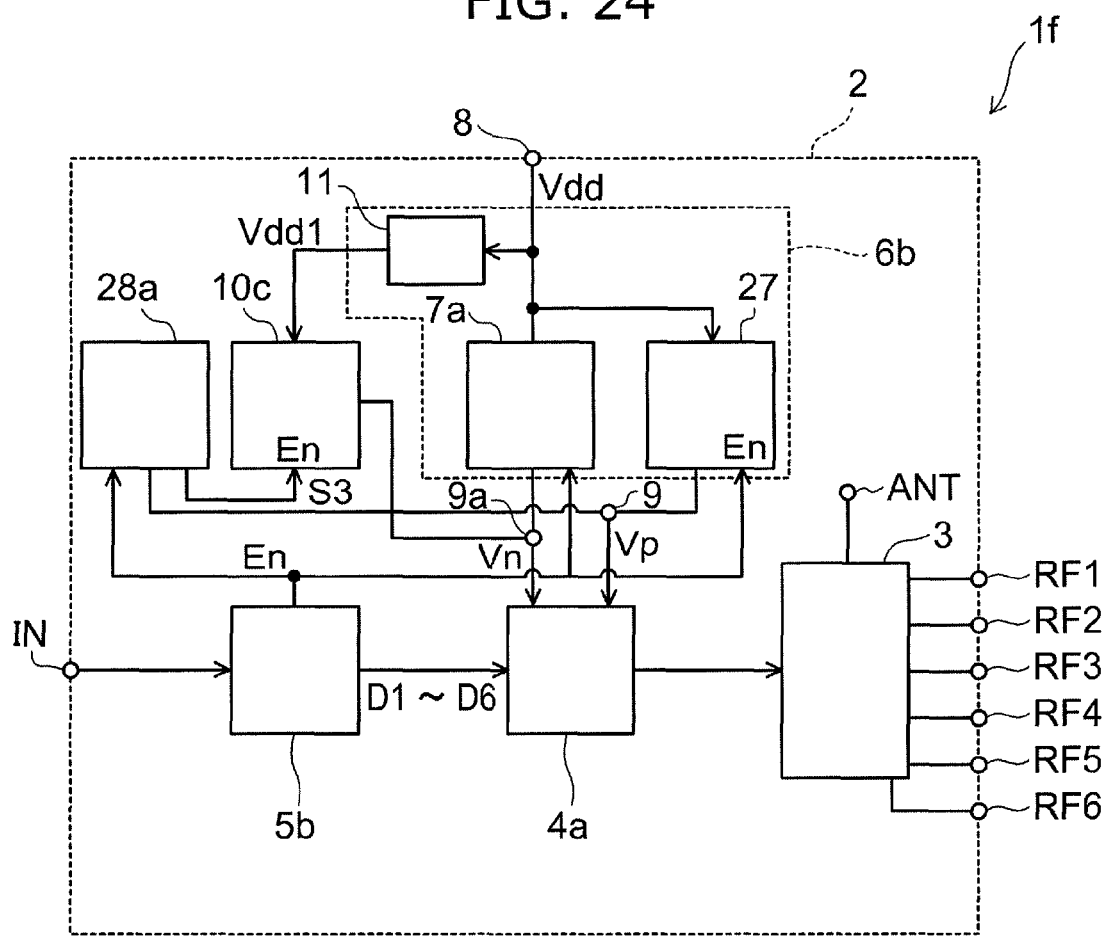
FIG. 25 is a block diagram illustrating a semiconductor switch according to a ninth embodiment.

FIG. 25 is a block diagram illustrating a semiconductor switch according to the ninth embodiment.

As illustrated in FIG. 25, the ninth embodiment is different from the seventh embodiment in the configuration of the second potential controller 28. Namely, in the ninth embodiment, a second potential controller 28a is provided instead of the second potential controller 28. A switch section 3, a driver 4a, an interface 5b, a power supply 6b, and a first potential controller 10c are the same as those in the seventh embodiment.

A semiconductor switch 1f has the function of the normal operation mode and the function of a sleep mode in which the current supply capacity of the power supply 6b to supply a first potential Vn and a third potential Vp is smaller than the current supply capacity in the normal operation mode.

The second potential controller 28a is additionally provided with a function of outputting an output signal S3 that a mode signal En is masked when turning on the power supply in the second potential controller 28 according to the seventh embodiment. The output signal S3 of the second potential controller 28a is supplied as the mode signal En of the first potential controller 10c to the first potential controller 10c.

Figure 26:
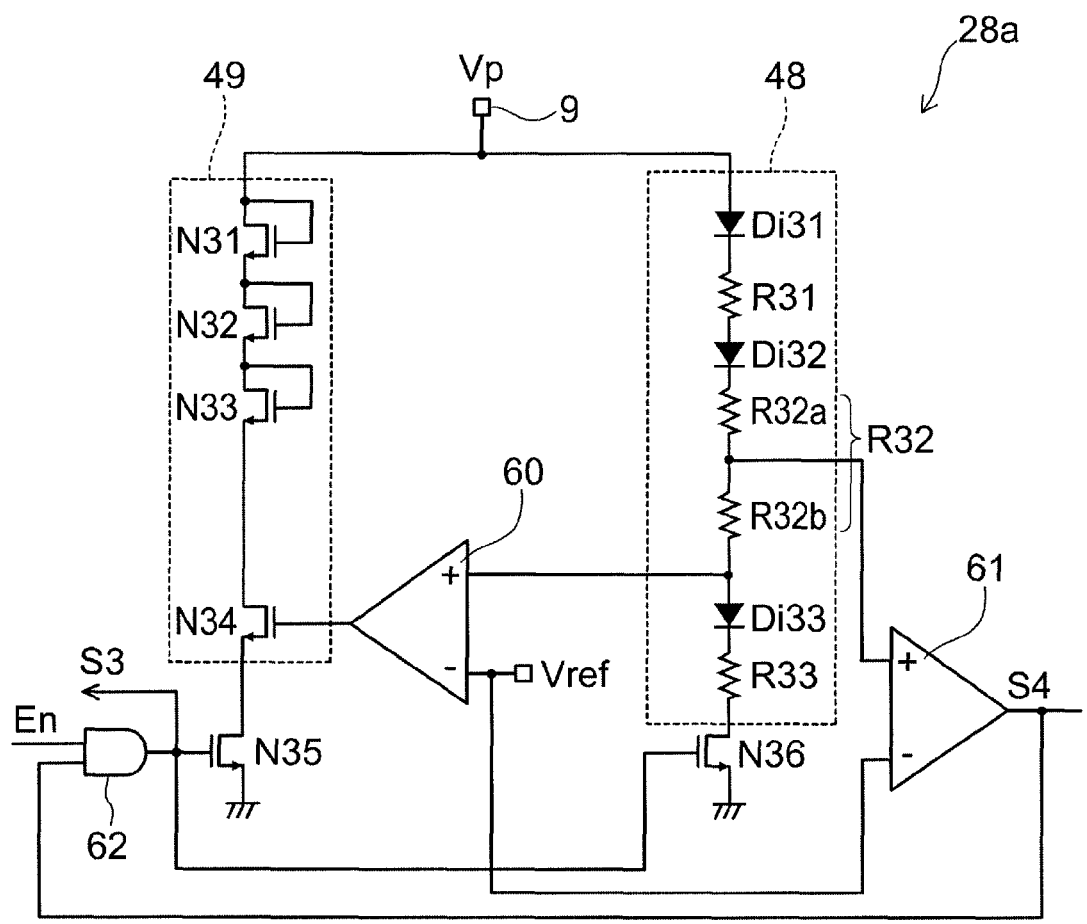
FIG. 26 is a circuit diagram illustrating a second potential controller according to the ninth embodiment.

FIG. 26 is a circuit diagram illustrating a second potential controller according to the ninth embodiment.

As illustrated in FIG. 26, the second potential controller 28a includes a comparator 61 and an AND circuit (AND) 62 additionally provided in the second potential controller 28, and the mode signal En is inputted to the gates of blocking transistors N35 and N36 through the AND 62. A resistor R32 is formed of resistors R32a and R32b connected in series.

The resistors R32a and R32b further divide the potential of the resistor R32 to generate a potential slightly higher than a potential inputted to the non-inverting input terminal of an amplifier 60 as the potential of the resistor R33, and supplies the potential to the non-inverting input terminal of the comparator 61. A reference potential Vref is inputted to the inverting input terminal of the comparator 61. The comparator 61 outputs high level when the potential of the non-inverting input terminal is higher than the potential of the inverting input terminal, whereas the comparator 61 outputs low level when the potential of the non-inverting input terminal is low. An output signal S4 of the comparator 61 is inputted to the AND 62.

The AND 62 generates an AND between the mode signal En and the output signal S4 of the comparator 61, and outputs the AND as the output signal S3 of the second potential controller 28a. The output signal S3 is inputted to the gates of the blocking transistors N35 and N36.

In the normal operation mode, that is, when the mode signal En is at high level, the output signal S4 of the comparator 61 is outputted as the output signal S3 of the second potential controller 28a. In the sleep mode, that is, when the mode signal En is at low level, the second potential controller 28a outputs low level as the output signal S3 regardless of the level of the output signal S4 of the comparator 61.

Figure 27A:
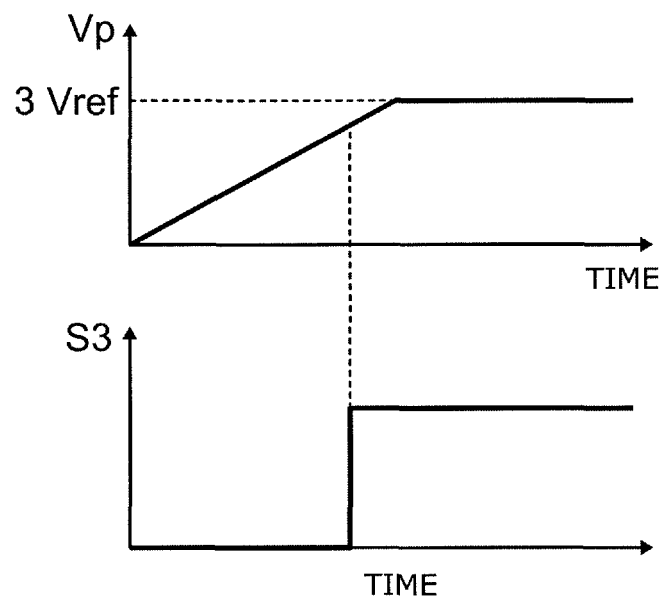
FIG. 27A and FIG. 27B are timing charts illustrating main signals of the second potential controller according to the ninth embodiment.
Figure 27B:
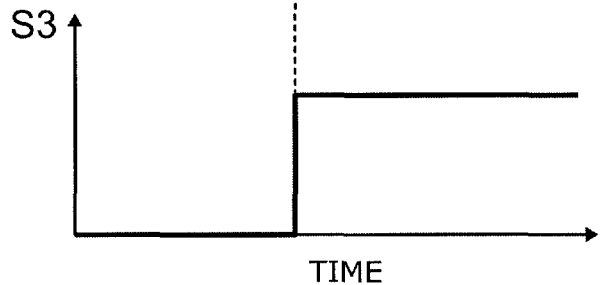

FIG. 27A and FIG. 27B are timing charts illustrating main signals of the second potential controller according to the ninth embodiment; FIG. 27A illustrates the third potential Vp and FIG. 27B illustrates the output signal S3 of the second potential controller.

As illustrated in FIG. 27A and FIG. 27B, when the mode signal En is at high level, the potential of the non-inverting input terminal of the second potential controller 28a is lower than the reference potential Vref until the third potential Vp is increased to a potential slightly lower than 3×Vref immediately after turning on the power supply (FIG. 27A). As a result, the second potential controller 28a outputs low level as the output signal S3 (FIG. 27B).

When the third potential Vp reaches a potential slightly lower than 3×Vref (FIG. 27A), the second potential controller 28a outputs high level as the output signal S3 (FIG. 27B).

As described above, in the normal operation mode, that is, when the mode signal En is at high level, the second potential controller 28a outputs low level as the output signal S3 until the third potential Vp is increased to a potential slightly lower than 3×Vref immediately after turning on the power supply. When the third potential Vp is increased beyond a potential slightly lower than 3×Vref, the second potential controller 28a outputs high level as the output signal S3.

Since the output signal S3 is inputted to the gates of the blocking transistors N35 and N36, a current is blocked in the second potential controller 28a in a period in which the output signal S3 immediately after turning on the power supply is at low level, and the second potential controller 28a is turned into a high impedance state. As a result, the leakage current of the high-potential supply terminal 9 is suppressed, so that it is possible to suppress an increase in start-up time because of the provision of the second potential controller 28.

As described above, since the output signal S3 is supplied as the mode signal En of the first potential controller 10c to the first potential controller 10c, a current is blocked in the first potential controller 10c in a period in which the output signal S3 is at low level, and the first potential controller 10c is turned into a high impedance state. As a result, the leakage current of the low-potential supply terminal 9a is suppressed, so that it is possible to suppress an increase in start-up time because of the provision of the first potential controller 28.

The effect of this embodiment other than the aforementioned effect is the same as the effect of the seventh embodiment.

Tenth Embodiment

Next, a tenth embodiment will be described.

Figure 28:
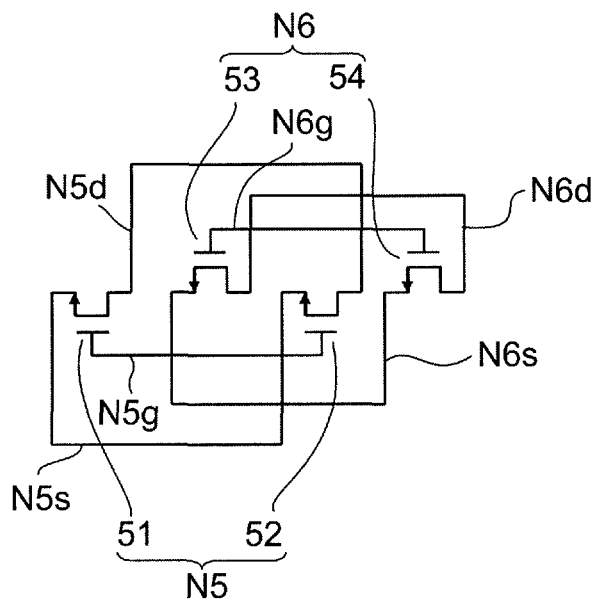
FIG. 28 is an equivalent circuit diagram illustrating a first transistor and a third transistor according to a tenth embodiment.

FIG. 28 is an equivalent circuit diagram illustrating a first transistor and a third transistor according to the tenth embodiment.

Figure 29:
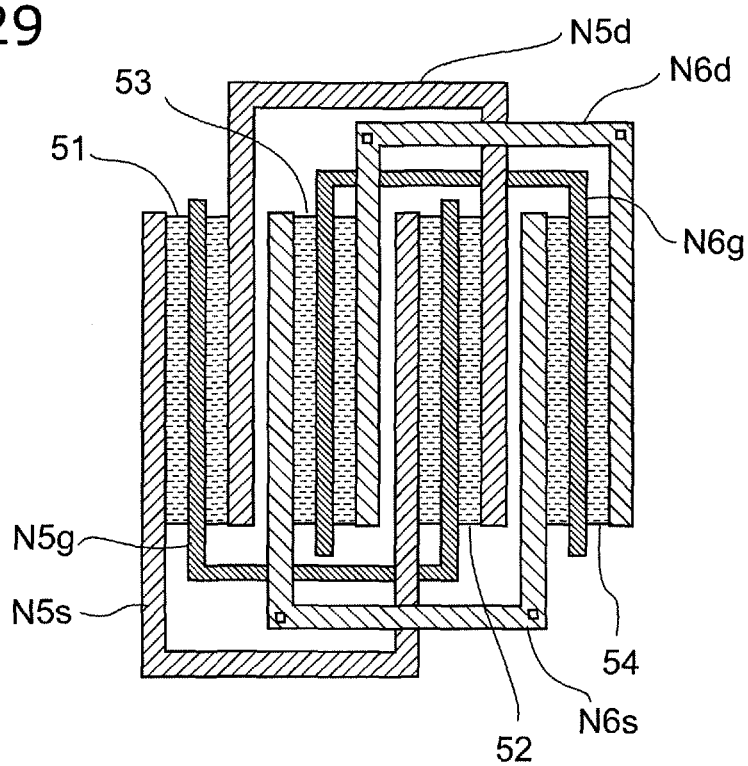
FIG. 29 is a plan view illustrating the layout of the first transistor and the third transistor according to the tenth embodiment.

FIG. 29 is a plan view illustrating the layout of the first transistor and the third transistor according to the tenth embodiment.

This embodiment is different from the aforementioned first, second, and third embodiment in the configuration of the first transistor and the third transistor. Namely, in this embodiment, the third transistor N5 according to the second embodiment is formed of a pair of transistors 51 and 52, and the first transistor N6 is formed of a pair of transistors 53 and 54. The configurations other than the configurations of the third transistor N5 and the first transistor N6 of the semiconductor switch according to this embodiment are the same as the configurations of the semiconductor switch 1a according to the second embodiment.

The third transistor N5 is formed of the pair of the transistors 51 and 52 connected in parallel with each other. The first transistor N6 is formed of the pair of the transistors 53 and 54 connected in parallel with each other. The transistor 52 is provided between the pair of the transistors 53 and 54, and the transistor 53 is provided between the pair of the transistors 51 and 52.

Namely, the pair of the transistors 51 and 52 and the pair of the transistors 53 and 54 are disposed in parallel with each other. The gate of the transistor 51 is connected to the gate of the transistor 52 through a gate interconnection N5g. The source of the transistor 51 is connected to the source of the transistor 52 through a source interconnection N5s. The drain of the transistor 51 is connected to the drain of the transistor 52 through a drain interconnection N5d. The gate of the transistor 53 is connected to the gate of the transistor 54 through a gate interconnection N6g. The source of the transistor 53 is connected to the source of the transistor 54 through a source interconnection N6s. The drain of the transistor 53 is connected to the drain of the transistor 54 through a drain interconnection N6d.

In this embodiment, the third transistor N5 is distributed and disposed as the pair of the transistors 51 and 52, and the first transistor N6 is distributed and disposed as the pair of the transistors 53 and 54. As a result, it is possible to suppress the influence of fluctuations in element characteristics caused by variations in the manufacturing processes or a change in temperature, and it is possible to suppress an increase in the third-order harmonic distortion for improving radio frequency characteristics.

It is noted that the layout illustrated in FIG. 29 is an exemplary illustration and the other layouts are also possible. For example, the third transistor N5 and the first transistor N6 may be distributed and disposed as four transistors disposed in point symmetry. It is sufficient that the electrodes of the transistors can be connected to each other for the interconnection, and the other layouts may be possible.

Eleventh Embodiment

Next, an eleventh embodiment will be described.

Figure 30:
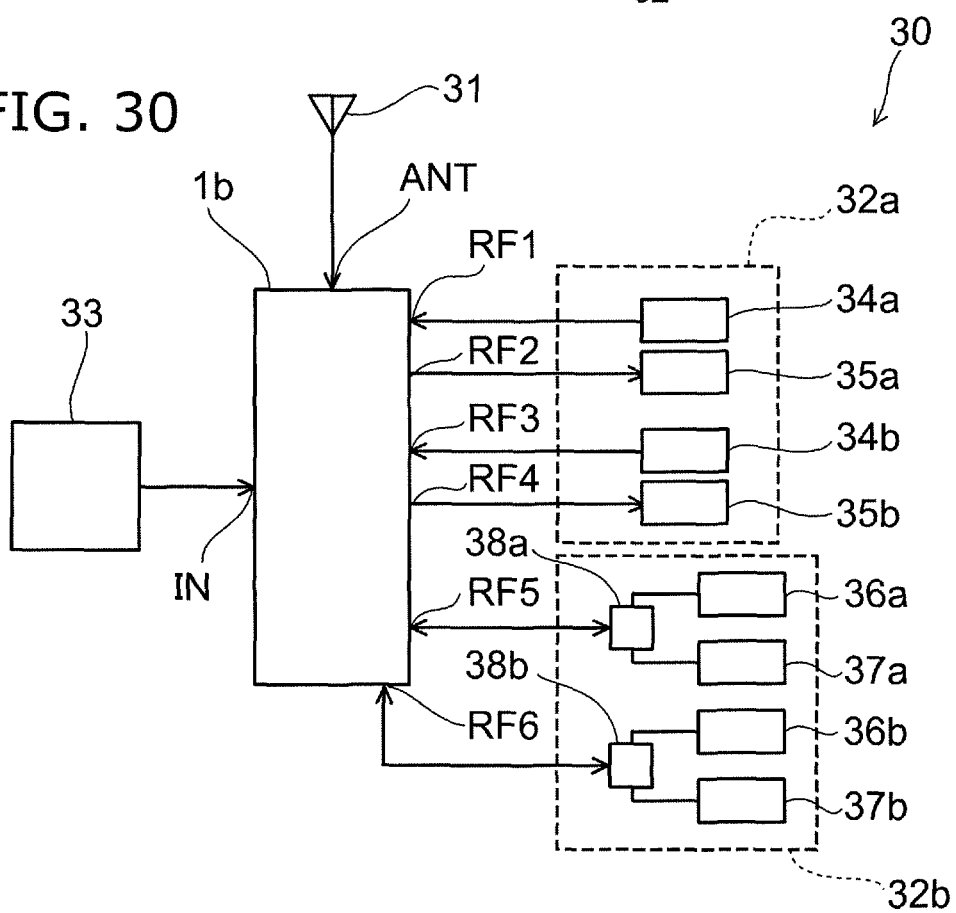
FIG. 30 is a block diagram illustrating a wireless device according to an eleventh embodiment.

FIG. 30 is a block diagram illustrating a wireless device according to the eleventh embodiment.

As illustrated in FIG. 30, a wireless device 30 includes a semiconductor switch 1b, an antenna 31, transmitting and receiving circuits 32a and 32b, and a wireless controller 33. The semiconductor switch 1b is the same as the semiconductor switch 1b according to the third embodiment, in which the connection between a common terminal ANT and six radio frequency terminals RF1 to RF6 is switched according to a terminal switching signal IN.

As described above, in the semiconductor switch 1b, a first potential controller 10b receives only decode signals D5 and D6 on the MSB side among decode signals D1 to D6 of the terminal switching signal IN. Therefore, the first potential controller 10b operates differently when the terminal switching signal IN is at the specified values of 5 and 6 from the operation of the first potential controller 10b when the terminal switching signal IN is at the other specified values. Thus, an increase in the third-order harmonic distortion is suppressed when switching the connection between the common terminal ANT and the radio frequency terminal RF5, or between the common terminal ANT and the radio frequency terminal RF6.

The common terminal ANT is connected to the antenna 31. The radio frequency terminals RF1 to RF6 are connected to the transmitting and receiving circuits 32a and 32b.

The antenna 31 sends and receives radio frequency signals in bands corresponding to the wireless communications of mobile phones, in bands corresponding to the GSM standard and the UMTS standard, for example, radio frequency signals of 800 M to 2 GHz, for example.

The transmitting and receiving circuit 32a includes transmitting circuits 34a and 34b and receiving circuits 35a and 35b, and sends and receives high-frequency signals according to the GSM standard. The transmitting circuit 34a modulates a transmission signal formed of information such as an audio signal, an image signal, binary data, or the like into a high-frequency signal according to the GSM standard, and outputs the high-frequency signal to the radio frequency terminal RF1 of the semiconductor switch 1b. The transmitting circuit 34b modulates a transmission signal into a high-frequency signal according to the GSM standard, and outputs the high-frequency signal to the radio frequency terminal RF2 of the semiconductor switch 1b.

The receiving circuit 35a receives a high-frequency signal according to the GSM standard inputted from the radio frequency terminal RF3, and demodulates the high-frequency signal into a received signal formed of information such as an audio signal, an image signal, binary data, or the like. The receiving circuit 35b receives a high-frequency signal according to the GSM standard inputted from the radio frequency terminal RF4, and demodulates a received signal.

The transmitting and receiving circuit 32b includes transmitting circuits 36a and 36b, receiving circuits 37a and 37b, and duplexers 38a and 38b, and sends and receives high-frequency signals according to the UMTS standard.

The transmitting circuit 36a modulates a transmission signal into a high-frequency signal according to the UMTS standard, and outputs the high-frequency signal to the radio frequency terminal RF5 through the duplexer 38a. The receiving circuit 37a receives the high-frequency signal according to the UMTS standard inputted from the radio frequency terminal RF5 through the duplexer 38a, and demodulates the high-frequency signal into a received signal.

The transmitting circuit 36b modulates a transmission signal into a high-frequency signal according to the UMTS standard, and outputs the high-frequency signal to the radio frequency terminal RF6 through the duplexer 38b. The receiving circuit 37b receives the high-frequency signal according to the UMTS standard inputted from the radio frequency terminal RF6 through the duplexer 38b, and demodulates the high-frequency signal into a received signal.

The wireless controller 33 outputs the terminal switching signal IN to the semiconductor switch 1b for controlling the connection between the terminals of the semiconductor switch 1b. The wireless controller 33 controls the transmitting and receiving circuits 32a and 32b. Namely, the wireless controller 33 controls the transmitting circuits 34a, 34b, 36a, and 36b, and the receiving circuits 35a, 35b, 37a, and 37b.

For example, in the case where signals are transmitted using the transmitting circuit 34a of the transmitting and receiving circuit 32a, the wireless controller 33 outputs the terminal switching signal IN to the semiconductor switch 1b to connect the common terminal ANT to the radio frequency terminal RF1 of the semiconductor switch 1b.

As described above, in the semiconductor switch 1b, the first potential controller 10b controls the first potential Vn to be −1.4 V, which is the optimum value for the GSM standard, in the case where the common terminal ANT is connected to any one of the radio frequency terminals RF1 to RF4. As a result, the first potential Vn is controlled to the first potential Vn optimum for the GSM standard with a large electric power, and an increase in the third-order harmonic distortion is suppressed.

In the semiconductor switch 1b, the first potential controller 10b controls the first potential Vn to be −0.8 V, which is the optimum value for the UMTS standard, in the case where the common terminal ANT and the radio frequency terminal RF5 are conducted to each other, or the common terminal ANT and the radio frequency terminal RF6 are conducted to each other. As a result, the first potential Vn is the first potential Vn optimum for the UMTS standard with a relatively small electric power.

Thus, according to the wireless device 30, it is possible to suppress an increase in the third-order harmonic distortion of the semiconductor switch 1b, and it is possible to individually transmit high-frequency signals according to the GSM standard and the UMTS standard from the antenna 31.

It is noted that in this embodiment, the configuration is explained in which the semiconductor switch 1b according to the second embodiment is used for the GSM standard and the UMTS standard. However, the semiconductor switches according to the other embodiments may be used, and the semiconductor switches according to the embodiments can also be used for the other wireless communication methods.

In the wireless device 30 according to this embodiment, modulation and demodulation are performed at the transmitting circuits 34a, 34b, 36a, and 36b, and the receiving circuits 35a, 35b, 37a, and 37b, respectively. However, such a configuration may be possible in which a common modulating and demodulating circuit is provided, a modulated signal is outputted to a transmitting circuit, and a signal inputted from a receiving circuit is demodulated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor switch comprising:
   a power supply including a first potential generator configured to generate a negative first potential and a second potential generator configured to generate a positive second potential;
   a driver supplied with the first potential and a positive third potential and configured to output at least one of the first potential and the third potential based on a signal;
   a switch section configured to connect a common terminal to any one of a plurality of radio frequency terminals according to an output of the driver; and
   a first potential controller, the first potential controller including:
   a first circuit connected between an output of the second potential generator and an output of the first potential generator and configured to divide a potential difference between the second potential and the first potential; and
   an amplifier connected the output of the second potential generator and the output of the first potential generator and configured to control the first potential so that a potential divided at the first circuit approaches a reference potential,
   the first circuit being configured to supply a bias potential to a constant current source that supplies a constant current to a differential pair of the amplifier.

2. The switch according to claim 1, wherein the first circuit includes a first element and a second element connected in series.

3. The switch according to claim 2, wherein the first element has a circuit configuration same as the second element.

4. The switch according to claim 3, wherein
the first element includes a first resistor having same resistance value of a second resistor in the second element.

5. The switch according to claim 2, wherein
an end of the first element is connected to an end of the second element, another end of the first element is connected to the output of the second potential generator, and another end of the second element is connected to the output of the first potential generator.

6. The switch according to claim 5, wherein
the first element includes a first resistor and a first transistor, and the second element includes a second resistor and a second transistor.

7. The switch according to claim 6, wherein
a node between the first element and the second element connects an input terminal of the amplifier.

8. The switch according to claim 6, wherein
a node between the second resistor and the second transistor supplies the bias potential to the constant current source.

9. The switch according to claim 1, wherein
the reference potential is set to a ground potential.

* * * * *